(12) United States Patent
Hasegawa et al.

(10) Patent No.: US 7,777,473 B2
(45) Date of Patent: Aug. 17, 2010

(54) DC-DC CONVERTER AND CONTROL CIRCUIT FOR DC-DC CONVERTER

(75) Inventors: Morihito Hasegawa, Kasugai (JP);
Chikara Tsuchiya, Kasugai (JP);
Hidenobu Ito, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/257,222

(22) Filed: Oct. 23, 2008

(65) Prior Publication Data

US 2009/0051339 A1 Feb. 26, 2009

Related U.S. Application Data

(62) Division of application No. 11/436,534, filed on May 19, 2006, now Pat. No. 7,456,623.

(30) Foreign Application Priority Data

Dec. 26, 2005 (JP) ............................. 2005-373476
Mar. 2, 2006 (JP) ............................. 2006-055904

(51) Int. Cl.
*G05F 1/575* (2006.01)
*G05F 1/656* (2006.01)
(52) U.S. Cl. ...................................... 323/284; 323/285
(58) Field of Classification Search ................. 323/222, 323/223, 224, 265, 271, 282, 284, 285, 351
See application file for complete search history.

(56) References Cited

U.S. PATENT DOCUMENTS 4,349,776 A 9/1982 Federico et al.

| 5,757,173 A | 5/1998 | Agiman |
| 5,912,552 A | 6/1999 | Tateichi |

(Continued)

FOREIGN PATENT DOCUMENTS

JP 4-101286 9/1992

(Continued)

OTHER PUBLICATIONS

Leo Francis Cassy; "Circuit Design for 1-10 MHZ DC-DC Conversion"; Massachusetts Institute of Technology; 1989; pp. 67-80.

(Continued)

*Primary Examiner*—Gary L Laxton
(74) *Attorney, Agent, or Firm*—Arent Fox LLP

(57) ABSTRACT

A DC-DC converter prevents through current from flowing in an output transistor. A first transistor receives an input voltage. A second transistor is connected to the first transistor. A comparator is connected to the second transistor. The comparator detects current flowing through a choke coil based on the potential difference between two terminals of the second transistor to generate a switching control signal for turning the second transistor on and off. The second transistor and the comparator form an ideal diode. A control circuit of the DC-DC converter generates an activation signal for turning the first transistor on and off based on a pulse signal to keep an output voltage constant. A through current prevention pulse generation circuit generates a pulse signal for turning off the second transistor from before the first transistor is turned on to after the first transistor is turned on.

3 Claims, 31 Drawing Sheets

U.S. PATENT DOCUMENTS

| | | |
|---|---|---|
| 6,198,263 B1 | 3/2001 | Chan |
| 6,307,356 B1 | 10/2001 | Dwelley |
| 6,396,250 B1 | 5/2002 | Bridge |
| 6,437,549 B1 | 8/2002 | Takagishi |
| 6,577,110 B2 | 6/2003 | Van Auken |
| 6,956,359 B2 * | 10/2005 | Dubhashi .................... 323/282 |
| 7,161,333 B2 * | 1/2007 | Soch ......................... 323/224 |
| 7,250,746 B2 * | 7/2007 | Oswald et al. .............. 323/284 |
| 2002/0105309 A1 | 8/2002 | Rutter et al. |
| 2005/0258811 A1 | 11/2005 | Matsuo et al. |

FOREIGN PATENT DOCUMENTS

| | | |
|---|---|---|
| JP | 06-303766 | 10/1994 |
| JP | 10-225105 | 8/1998 |

OTHER PUBLICATIONS

Find; "PFM and PWM synchronous rectification step-down regulator"; Fujitsu Limited; 2003; pp. 45-47; vol. 21; No. 5.

Find; "PFM and PWM synchronous rectification step-down DC-DC converter IC"; Fujitsu Limited; 2004; pp. 28-31; vol. 22; No. 6.

* cited by examiner

DC-DC CONVERTER AND CONTROL CIRCUIT FOR DC-DC CONVERTER

CROSS-REFERENCE TO RELATED APPLICATIONS

This application is a divisional of U.S. patent application Ser. No. 11/436,534, filed May 19, 2006 and claims the benefit of priority from the prior Japanese Patent Applications No. 2006-055904, filed on Mar. 2, 2006, and No. 2005-373476, filed on Dec. 26, 2005, the entire contents of which are incorporated herein by reference.

BACKGROUND OF THE INVENTION

The present invention relates to a DC-DC converter, and more particularly, to a control circuit for a DC-DC converter.

In the prior art, electronics devices, such as personal computers, use DC-DC converters as power supplies. Electronics devices are required to reduce power consumption. Accordingly, DC-DC converters are required to reduce power consumption.

In a switching DC-DC converter of the prior art, a first output MOS transistor is turned on so that energy is supplied from its input to its output. The first MOS transistor is turned off so that energy accumulated in an inductor is discharged. When the energy is discharged, the forward voltage of a rectifier diode drops. As a result, some of the energy accumulated in the inductor is lost.

To prevent this, the DC-DC converter includes a second MOS transistor, in lieu of the rectifier diode, and further includes a comparator, which is connected to the source and drain of the second MOS transistor. The comparator detects the current flowing through the inductor based on the potential difference between the two terminals of the second MOS transistor and turns the second MOS transistor on and off based on the detection result. When current flows from a load to ground via the inductor, the second MOS transistor is turned off in response to an output signal of the comparator. This prevents the efficiency of the DC-DC converter from decreasing in a low load state.

U.S. Pat. No. 4,349,776, Japanese Laid-Open Utility Model Publication No. 4-101286, Japanese Laid-Open Patent Publication No. 6-303766, U.S. Pat. No. 5,912,552, and Japanese Laid-Open Patent Publication No. 10-225105 describe the above structure.

The above structure is also found in Leo Francis Cassy, "Circuit Design for 1-10 MHZ DC-DC Conversion", Massachusetts Institute of Technology 1989, January 1989, in "PFM and PWM synchronous rectification step-down regulator", FIND, Fujitsu Limited, 2003, Vol. 21, No. 5, pp. 45-47, and in "1-channel PFM and PWM synchronous rectification step-down DC-DC converter IC", FIND, Fujitsu Limited, 2004, Vol. 22, No. 6, pp. 28-31.

SUMMARY OF THE INVENTION

The comparator generates a signal for controlling the second MOS transistor based on the potential difference between the two terminals of the second MOS transistor when the first MOS transistor is turned on. If this signal is delayed, the first MOS transistor and the second MOS transistor may be on at the same time. If this happens, a large through current flows via the transistors and increases power consumption.

The present invention provides a DC-DC converter that prevents through current from flowing in an output transistor and provides a control circuit for such a DC-DC converter.

One aspect of the present invention is a DC-DC converter for generating an output voltage from an input voltage. The DC-DC converter includes a first transistor for receiving the input voltage. A second transistor is connected to the first transistor. A choke coil is connected to a node between the first transistor and the second transistor. A comparator, connected to the second transistor, for detecting current flowing through the choke coil to generate a switching control signal for controlling the second transistor to turn on and off. A control circuit, connected to the first transistor, for controlling the first transistor to turn on and off so as to keep the output voltage constant. A pulse generation circuit, connected to the control circuit, for generating a pulse signal for turning off the second transistor during a predetermined period from before the first transistor is turned on to after the first transistor is turned on.

Another aspect of the present invention is a control circuit for a DC-DC converter that generates an output voltage from an input voltage. The DC-DC converter includes a first transistor for receiving the input voltage, a second transistor connected to the first transistor, a choke coil connected to a node between the first transistor and the second transistor, and a comparator, connected to the second transistor, for detecting current flowing through the choke coil to generate a switching control signal for controlling the second transistor to turn on and off. The control circuit controls the first transistor to turn on and off so as to keep the output voltage constant. The control circuit includes a pulse generation circuit for generating a pulse signal for turning off the second transistor during a predetermined period from before the first transistor is turned on to after the first transistor is turned on.

A further aspect of the present invention is a method for controlling a DC-DC converter that generates an output voltage from an input voltage. The DC-DC converter includes a first transistor for receiving the input voltage, a second transistor connected to the first transistor, a choke coil connected to a node between the first transistor and the second transistor, and a comparator, connected to the second transistor, for detecting current flowing through the choke coil to generate a switching control signal for controlling the second transistor to turn on and off. The method includes controlling the first transistor to turn on and off so as to keep the output voltage constant, detecting current flowing through the choke coil, and controlling the second transistor to turn on and off based on the current detected. The controlling the second transistor includes turning off the second transistor during a predetermined period from before the first transistor is turned on to after the first transistor is turned on.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A DC-DC converter 1 according to a first embodiment of the present invention will now be described with reference to FIG. 1.

Figure 1:
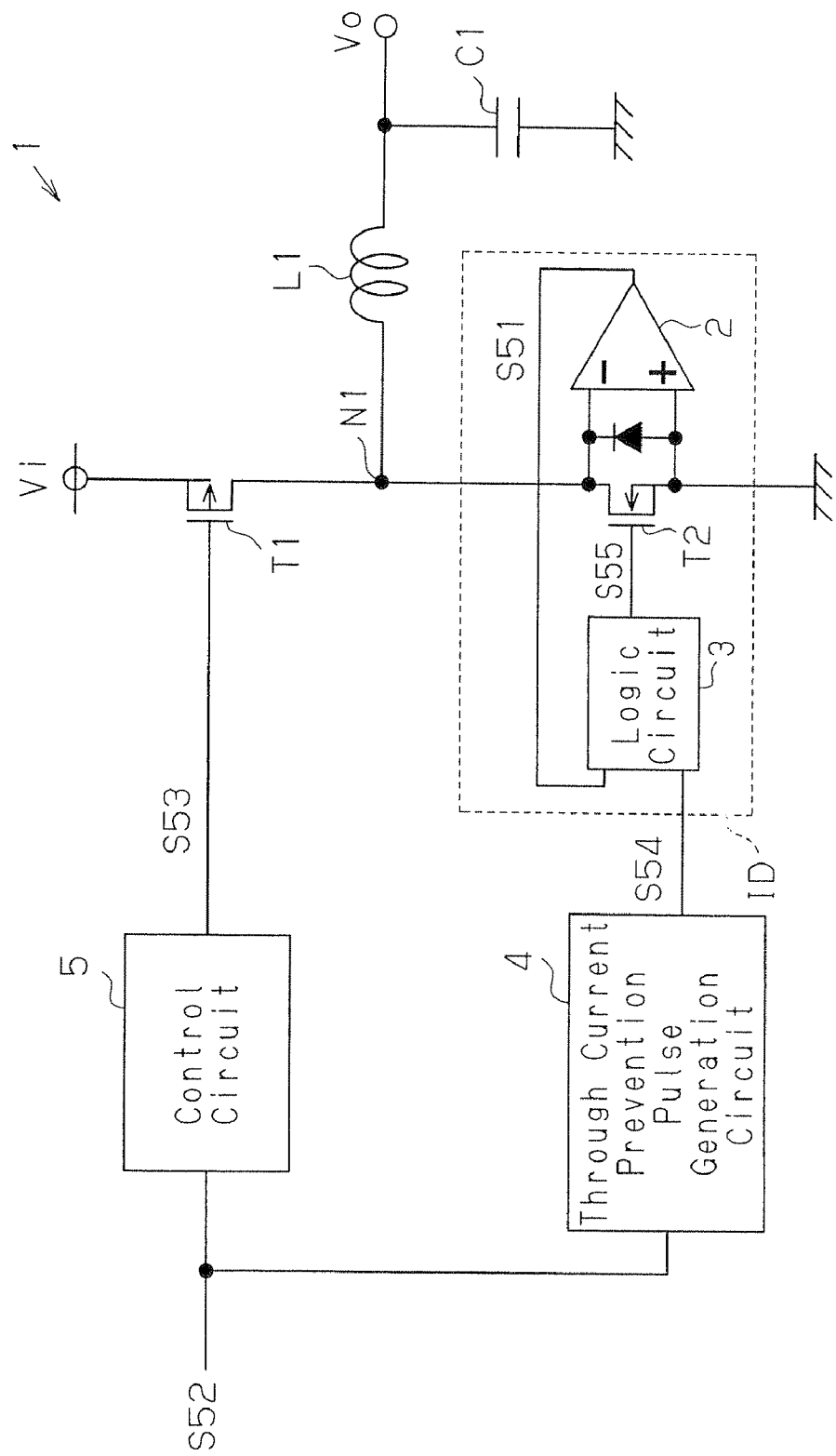
FIG. 1 is a schematic block circuit diagram of a DC-DC converter according to a first embodiment of the present invention.

FIG. 1 is a schematic block diagram of the DC-DC converter 1 of the first embodiment. The DC-DC converter 1 includes a first transistor T1 and a second transistor T2. The first transistor T1 is supplied with a first voltage Vi. The second transistor T2 is connected to the first transistor T1. A choke coil L1 is connected to a node N1 between the first transistor T1 and the second transistor T2.

A comparator 2 is connected to the second transistor T2. The comparator 2 detects the current flowing through the choke coil L1 based on the potential difference between the two terminals of the second transistor T2 to generate a signal S51 (switching control signal) for turning on and off the second transistor T2. Further, a logic circuit 3 is connected to a control terminal of the second transistor T2. The logic circuit 3 is provided with the signal S51 from the comparator 2 and a pulse signal S54 from a through current prevention pulse generation circuit 4. The logic circuit 3 generates a signal S55 for controlling the second transistor T2 based on the signal S51 and the pulse signal S54. In the first embodiment, the second transistor T2, the comparator 2, and the logic circuit 3 form an ideal diode ID.

A control circuit 5 generates a signal S53 for turning on and off the first transistor T1 based on a pulse signal S52. The first transistor T1 is controlled based on the signal S53 so that the first voltage Vi is converted into an output voltage Vo. The converted output voltage Vo is supplied to a load via the choke coil L1. The control circuit 5 turns the first transistor T1 on and off so as to keep the output voltage Vo constant. The through current prevention pulse generation circuit 4 generates, based on the pulse signal S52, the pulse signal S54 for turning off the second transistor T2 in a predetermined period from before the first transistor T1 is turned on to after the first transistor T1 is turned on. More specifically, the pulse signal S54 is provided to the logic circuit 3. The logic circuit 3 sets the signal S55 to a low (L) level in response to a rising edge (or a falling edge) of the pulse signal S54. This ensures that the second transistor T2 remains off based on the signal S55 for at least a period corresponding to the pulse width of the pulse signal S5. Unlike a semiconductor diode of which the forward voltage drops, the forward voltage of the ideal diode ID does not drop. Further, the impedance of the ideal diode ID is infinite in the backward direction. Thus, the diode ID has ideal rectification characteristics.

The operation of the DC-DC converter 1 shown in FIG. 1 will now be described. The control circuit 5 turns off the first transistor T1 in a state in which the first transistor T1 is on and the second transistor T2 is off. Then, the energy accumulated in the choke coil L1 is discharged and current flows from ground to an output terminal via a body diode of the second transistor T2. As a result, the comparator 2 generates the signal S51 at a high (H) level. The logic circuit 3 generates the signal S55 at an H level based on the signal S51 and the signal S54, which is provided from the through current prevention pulse generation circuit 4. The second transistor T2 is turned on in response to the H level signal S55. In this case, the voltage drop that occurs in the second transistor T2 is reduced as compared with the forward voltage drop of the diode. As a result, the efficiency of the DC-DC converter 1 is improved.

The control circuit 5 turns on the first transistor T1 in a state in which the first transistor T1 is off and the second transistor T2 is on. As a result, the through current prevention pulse generation circuit 4 generates a one-shot pulse signal S54 at a timing slightly before the timing at which the first transistor T1 is turned on. The logic circuit 3 generates the signal S55 at a low (L) level in response to the signal S54. The second transistor T2 is turned off in response to the L level signal S55. This prevents a through current from flowing through the first transistor T1 and the second transistor T2 when the first transistor T1 is turned on. When the first transistor T1 is turned on, the potential at the output node N1 increases, and the output of the comparator 2 falls to an L level. Thus, even after the pulse period of the one-shot pulse signal S53 ends, the second transistor T2 remains off until the first transistor T1 is turned on.

In the DC-DC converter 1 shown in FIG. 1, the ideal diode ID, which is formed by the second transistor T2, the comparator 2, and the logic circuit 3, prevents a voltage drop caused by a rectifier. Further, the second transistor T2 is turned off in accordance with the timing at which the first transistor T1 is turned on based on the one-shot pulse signal S54, which is generated by the through current prevention pulse generation circuit 4. This prevents a through current from flowing through the first and second transistors T1 and T2.

A DC-DC converter 10 according to a second embodiment of the present invention will now be described with reference to FIG. 2.

The DC-DC converter 10 of the second embodiment lowers an input voltage Vi, which is supplied as a first voltage, and generates an output voltage Vo based on the input voltage Vi.

The DC-DC converter 10, which is a current controlled DC-DC converter, includes a control circuit 11, a choke coil L1, and a smoothing capacitor C1. The DC-DC converter 10 stabilizes the output voltage Vo by performing a current mode operation. In the current mode operation, an error amplifier amplifies the difference between a reference voltage and the output voltage Vo and a current comparator compares the amplified voltage with a voltage that is proportional to a current flowing through the choke coil L1. The peak current of the choke coil L1 is controlled based on the comparison result so as to stabilize the output voltage Vo.

A first terminal of the choke coil L1 is connected to an output terminal of the control circuit 11. A second terminal of the choke coil L1 is connected to a semiconductor integrated circuit device (not shown), which serves as a load. The control circuit 11 supplies the output voltage Vo to the load via the choke coil L1. The smoothing capacitor C1 is connected to the second terminal of the choke coil L1. The smoothing capacitor C1 smoothes the output voltage Vo. The output voltage Vo is supplied to the control circuit 11 as a feedback signal FB.

The feedback signal FB is provided to an inversion input terminal of an error amplifier 21. A non-inversion input terminal of the error amplifier 21 is supplied with a reference voltage Vr1 of a reference power supply e1. The error amplifier 21 amplifies the voltage of the feedback signal FB, that is, the difference between the output voltage Vo and the reference voltage Vr1, and provides a current comparator 22 with a signal S1 having the amplified voltage.

The current comparator 22 is provided with the output signal S1 of the error amplifier 21, and an output signal S8 of a current detection circuit 32. The current comparator 22 compares the signals S1 and S8 and provides a flip-flop (FF) circuit 23 with a signal S2 having an H level or an L level in accordance with the comparison result.

The FF circuit 23, which is an RS-FF circuit, has a set terminal S provided with the signal S2 and a reset terminal R provided with a clock signal CK having a predetermined cycle. The clock signal CK is generated by an oscillator (OSC) 24. The OSC 24 is provided with an operation control signal CT2. The OSC 24 stops operating or starts operating based on the operation control signal CT2. The FF circuit 23 sets a signal (activation signal) S3 in response to an H level signal S2, which is provided to the set terminal S. The FF circuit 23 provides the signal S3 at an H level from its output terminal Q to an OR circuit 25. Further, the FF circuit 23 resets the signal S3 or sets the signal S3 to an L level in response to an H level clock signal CK, which is provided to the reset terminal R. The L level signal S3 is provided to the OR circuit 25. The OR circuit 25 is provided with the signal S3 and the operation control signal CT2. The OR circuit 25, which performs a logical OR operation with the signals S3 and CT2, provides a driver circuit 26 with a signal S4 showing the operation result.

The driver circuit 26 is provided with the output signal S4 of the OR circuit 25 and a first pulse signal S5 of a through current prevention pulse generation circuit 27, which will be described later. The driver circuit 26, which performs a logical OR operation with the signals S4 and S5, generates a first control signal DH showing the operation result.

The through current prevention pulse generation circuit 27 includes a first one-shot circuit 28 and a second one-shot circuit 29. The first one-shot circuit 28 and the second one-shot circuit 29 are provided with the clock signal CK from the OSC 24. The first one-shot circuit 28 generates a first pulse signal S5 having a predetermined pulse width in response to a rising edge of the clock signal CK. The second one-shot circuit 29 generates a second pulse signal S6 having a predetermined pulse width in response to a rising edge of the clock signal CK. The pulse width of the first pulse signal S5 and the pulse width of the second pulse signal S6 are each set in accordance with the signal delay time in the control circuit 11. The pulse width of the second pulse signal S6 is greater than the pulse width of the first pulse signal S5.

The first control signal DH is provided to a first output MOS transistor T1, which serves as a first switching element. The first MOS transistor T1, which is formed, for example, by a P-channel MOS transistor, has a gate (control terminal) provided with the first control signal DH, a source provided with the input voltage Vi, and a drain connected to the choke coil L1. The first MOS transistor T1 is turned on in response to an L level first control signal DH and turned off in response to an H level first control signal DH.

A second MOS transistor T2, which serves as a second switching element, is connected to an output node N1 between the first MOS transistor T1 and the choke coil L1. The second MOS transistor T2 is formed, for example, by an N-channel MOS transistor, and has a drain connected to the first MOS transistor T1, a source connected to ground serving as a second voltage, and a gate connected to an AND circuit 30 serving as a signal synthesizing circuit. Further, the source and drain of the second MOS transistor T2 are connected to a comparator 31. More specifically, the drain of the second MOS transistor T2 is connected to an inversion input terminal of the comparator 31, and the source of the second MOS transistor T2 is connected to a non-inversion input terminal of the comparator 31. The comparator 31 detects the current flowing through the choke coil L1 based on the potential difference between the source and the drain of the second MOS transistor T2. The comparator 31 generates a signal S7 at an H level or an L level (switching control signal) in accordance with the detection result. The signal S7 is provided to the AND circuit 30. The AND circuit 30 is further provided with the second pulse signal S6. The AND circuit 30, which performs the logical AND operation with an inversion signal of the second pulse signal S6 and the signal S7, generates a second control signal DL showing the operation result. The second control signal DL is provided to the gate (control terminal) of the second MOS transistor T2. The second MOS transistor T2 is turned on when the second control signal DL has an H level and turned off when the second control signal DL has an L level.

Figure 5A:
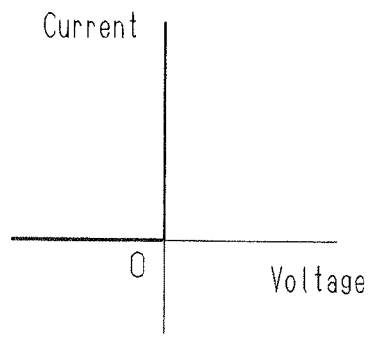
FIG. 5(a) is a graph showing the voltage-current characteristic of an ideal diode.
Figure 5B:
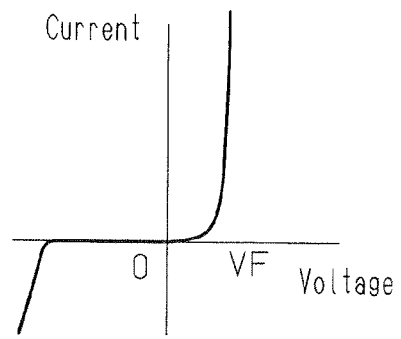
FIG. 5(b) is a graph showing the voltage-current characteristic of a semiconductor diode.

In the above structure, the second MOS transistor T2, the AND circuit 30, and the comparator 31 form an ideal diode ID. FIG. 5(a) shows the voltage-current characteristic of the ideal diode ID. FIG. 5(b) shows the voltage-current characteristic of a typical semiconductor diode. Current flows through the ideal diode ID when its forward voltage VF is zero. Because the impedance of the ideal diode ID is infinite in the backward direction, no current flows through the ideal diode ID in the backward direction. Thus, the ideal diode ID has the ideal rectification characteristics. The forward voltage of the ideal diode ID does not drop. This reduces the loss of the energy accumulated in the choke coil L1 that occurs when the first MOS transistor T1 is turned off. As a result, the efficiency of the DC-DC converter 10 is prevented from decreasing when the output voltage is low.

The output node N1 is connected to the current detection circuit 32. The current detection circuit 32 detects the current flowing through the choke coil L1 based on the potential at the output node N1 to generate a signal S8 having a voltage that is proportional to the detected current.

The operation control signal CT2 is provided to the OSC 24 from an OR circuit 34. The OR circuit 34 is provided with an output signal CT1 of a buffer circuit 35 and an output signal S10 of an erroneous operation prevention circuit 36. The buffer circuit 35 is provided with an external control signal CTL. The external control signal CTL is a signal for controlling the DC-DC converter 10. That is, the external control signal CTL is a so-called power down signal for controlling the DC-DC converter 10. The output signal CT1 of the buffer circuit 35 is also provided to the erroneous operation prevention circuit 36. The erroneous operation prevention circuit 36 prevents erroneous operation of the DC-DC converter 10 that may occur when the input voltage Vi, which is the power supply voltage, drops instantaneously. The erroneous operation prevention circuit 36 detects a voltage drop of the input voltage Vi. Upon detection of the voltage drop, the erroneous operation prevention circuit 36 generates the signal S10 for setting the output node N1 to a predetermined level (e.g., an L level) or high impedance. The OR circuit 34 performs the logical OR operation with an inversion signal of the signal CT1 and the signal S10 to generate an operation control signal CT2 showing the operational result as a power down signal.

The operation of the DC-DC converter 10 with the above-described structure will now be described.

The first output MOS transistor T1 is turned on in response to an L level first control signal DH and turned off in response to an H level first control signal DH. The fall of the first control signal DH is delayed with respect to the rise of the clock signal CK by the time corresponding to a first pulse width (pulse width of the signal S5). Thus, the first MOS transistor T1 is turned on at a timing delayed from the rise of the clock signal CK by the time corresponding to the first pulse width. In other words, the control circuit 11 turns on the first MOS transistor T1 in predetermined cycles based on the frequency of the output clock signal CK of the OSC 24. The control circuit 11 then turns off the first MOS transistor T1 when a predetermined time elapses in accordance with the output voltage Vo.

When the first MOS transistor T1 is turned on, the current flowing through the choke coil L1 increases and the output voltage of the current detection circuit 32 increases. When the output voltage of the current detection circuit 32 becomes higher than the output voltage of the error amplifier 21, the set terminal S of the FF circuit 23 is provided with an H level signal S2, and the output signal S3 of the FF circuit 23 is set to an H level. As a result, the first output MOS transistor T1 is turned off, and the energy accumulated in the choke coil L1 is discharged.

When the output voltage Vo decreases during the on or off operation of the first MOS transistor T1, the output voltage of the error amplifier 21 increases. This lengthens the time taken by the output signal S2 of the current comparator 22 to shift from an L level to an H level. As a result, the on-time of the first MOS transistor T1 relatively increases. When the output voltage Vo increases, the output voltage of the error amplifier 21 decreases. This shortens the time taken by the output signal S2 of the current comparator 22 to shift from an L level to an H level. As a result, the on-time of the first MOS transistor T1 relatively decreases. With this operation, the first MOS transistor T1, which has been turned on in predetermined cycles, is turned off at a timing determined based on the output current IL. The timing at which the first MOS transistor T1 is turned off changes based on the output voltage Vo so as to keep the output voltage Vo constant.

Figure 3:
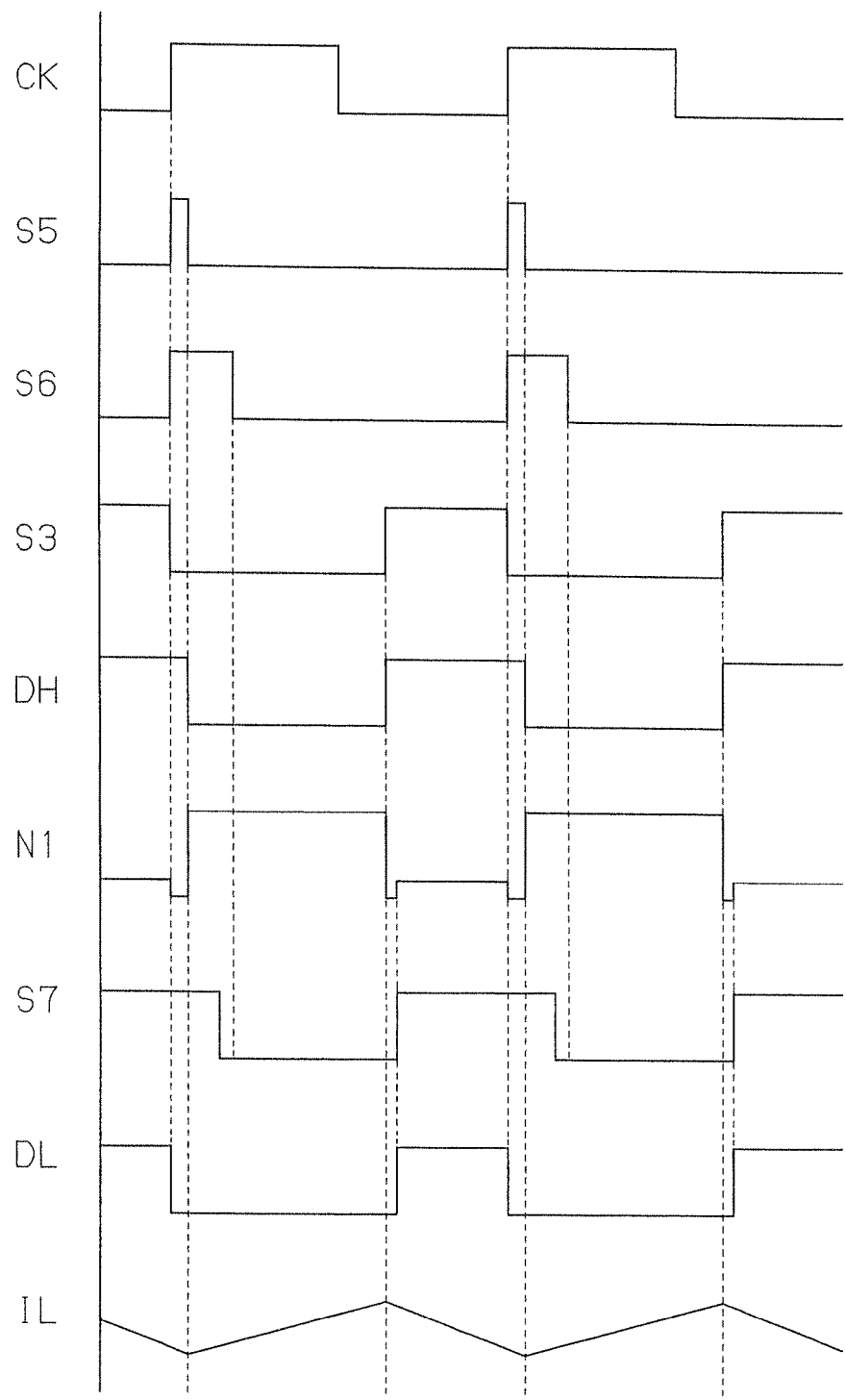
FIG. 3 is an operational waveform diagram of the DC-DC converter of FIG. 2 in a continuous mode.
Figure 4:
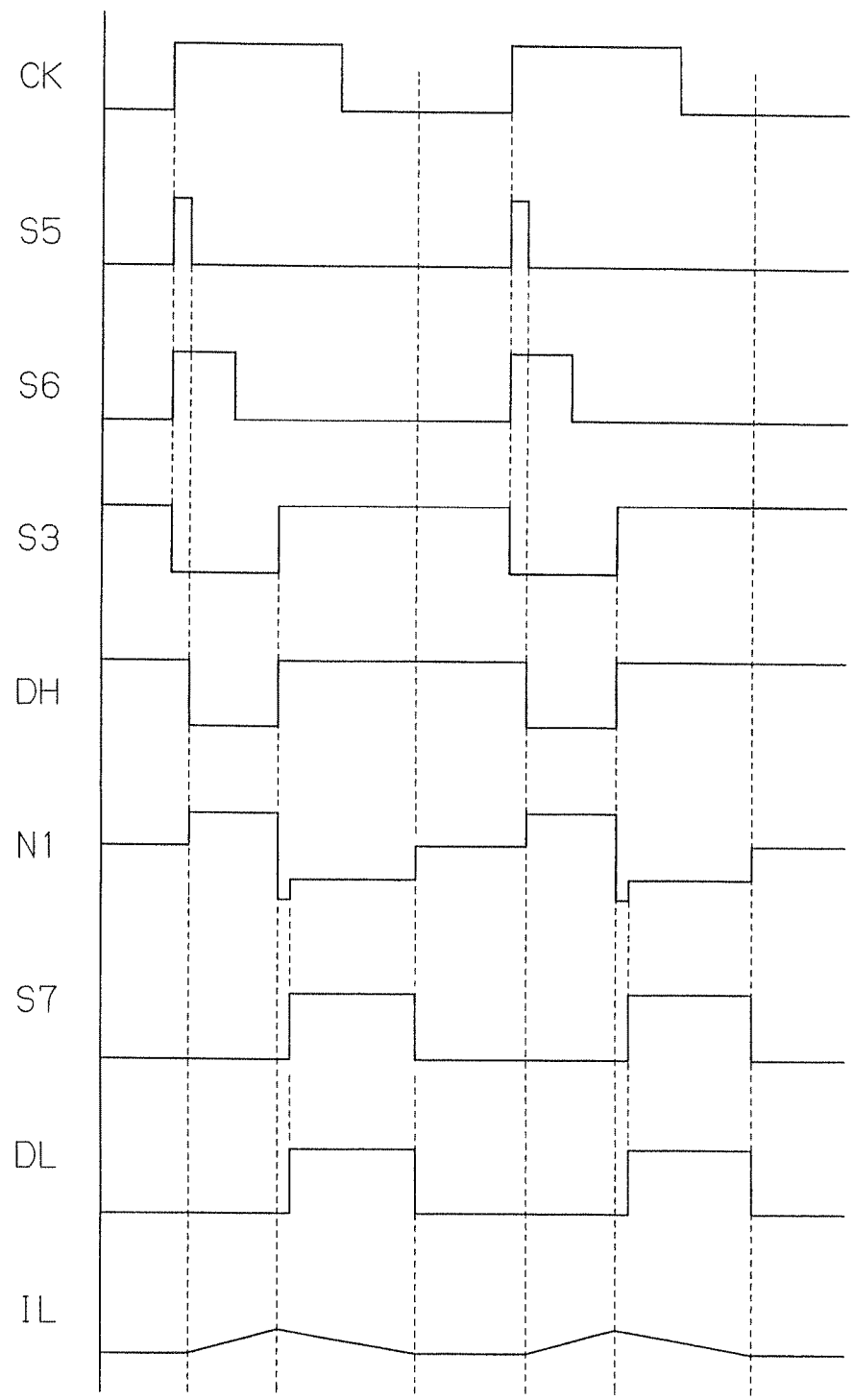
FIG. 4 is an operational waveform diagram of the DC-DC converter of FIG. 2 in a discontinuous mode.

As shown in FIGS. 3 and 4, the first one-shot circuit 28 generates the first pulse signal S5 having the first pulse width in response to a rising edge of the clock signal CK. The second one-shot circuit 29 generates the second pulse signal S6 having the second pulse width in response to the rising edge of the clock signal CK. FIG. 3 is an operational waveform diagram of the DC-DC converter 10 in a continuous mode. In the continuous mode, the first MOS transistor T1 is continuously turned on and off. FIG. 4 is an operational waveform diagram of the DC-DC converter 10 in a discontinuous mode.

The FF circuit 23 generates an L level signal S3 in response to a rising edge of the clock signal CK and generates an H level signal S3 in response to a signal S2 (not shown in FIGS. 3 and 4) corresponding to the output voltage Vo. The OR circuit 25 generates a signal S4 (not shown in FIGS. 3 and 4) having the same level as the signal S3 in response to an L level operation control signal CT2. As a result, the pulse width of the L level signal S3 (S4) and the pulse width of the H level signal S3 (S4) change in accordance with the output voltage Vo.

The driver circuit 26 generates a first control signal DH by performing the logical OR operation of the first pulse signal S5 and the signal S4. The signal S4, or the signal S3, falls to an L level in response to rise of the clock signal CK. The first pulse signal S5 is maintained at an H level for the time corresponding to the first pulse width after the rise of the pulse signal S5. As a result, the first control signal DH falls at the timing delayed with respect to the signal S3 by the time corresponding to the first pulse width. In other words, the first one-shot circuit 28 and the driver circuit 26 delay the fall of the output signal S3 of the FF circuit 23 by the time corresponding to the first pulse width.

The second one-shot circuit 29 generates the second pulse signal S6 having the second pulse width in response to rise of the clock signal CK. The AND circuit 30 is provided with an inversion signal of the second pulse signal S6. Thus, the AND circuit 30 generates an L level control signal DL for at least the period during which the second pulse signal S6 has an H level. The second MOS transistor T2 is turned off in response to the L level control signal DL. In other words, the second MOS transistor T2 remains off for at least the time corresponding to the second pulse width after the rise of the clock signal CK. As a result, the first MOS transistor T1 and the second MOS transistor T2 are both off for the time corresponding to the first pulse width after the rise of the clock signal CK. The second pulse width is greater than the first pulse width. Thus, even after the first MOS transistor T1 is turned on, the second MOS transistor T2 remains in the off state due to the L level control signal DL.

When the first MOS transistor T1 is turned on, the input voltage Vi causes the potential at the output node N1 to increase. In this case, the comparator 31 generates an L level signal S7 while the first MOS transistor T1 is on. Thus, even after the second pulse signal S6 falls to an L level, the second MOS transistor T2 remains in the off state due to the L level output signal S7 provided from the comparator 31.

Figure 2:
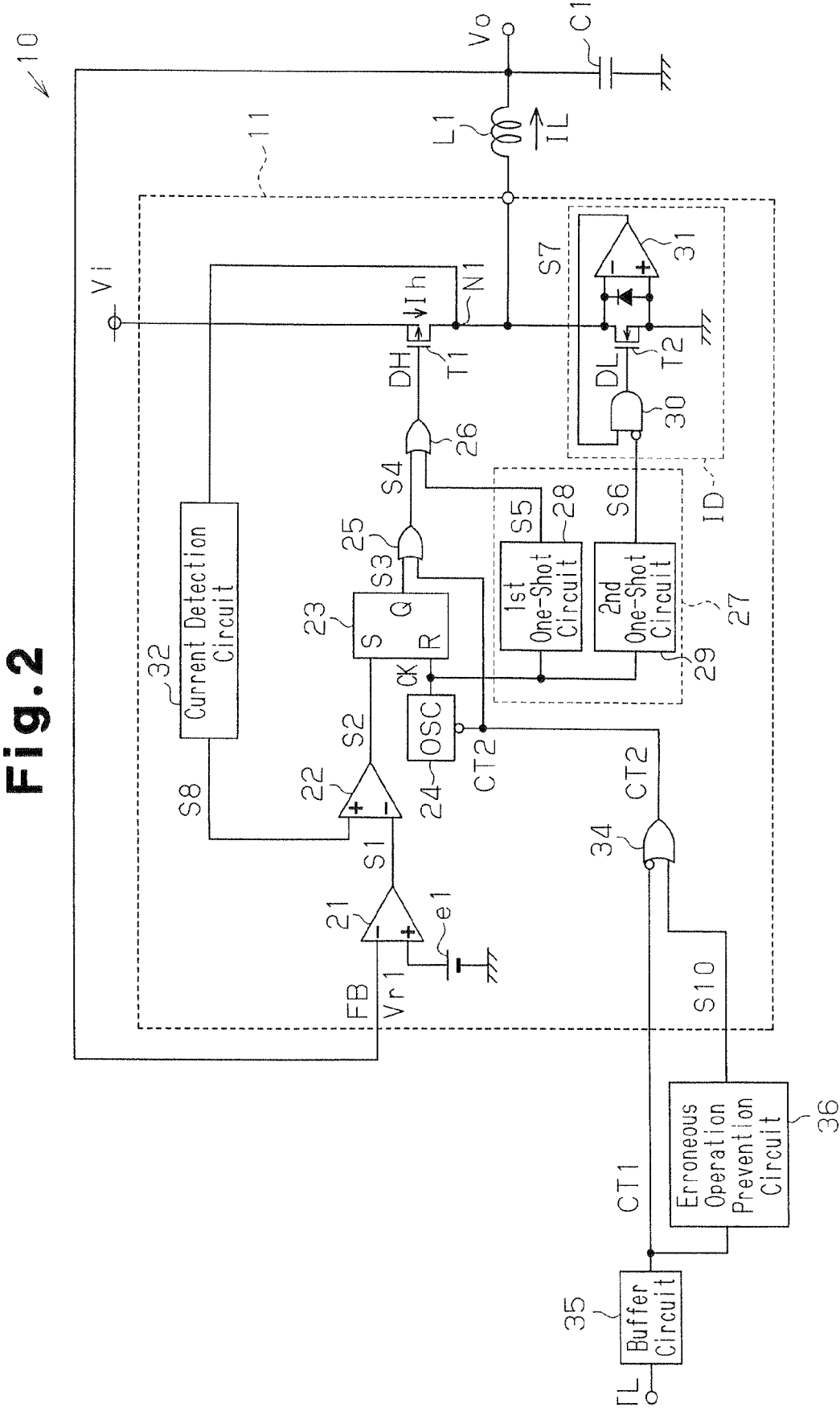
FIG. 2 is a schematic circuit diagram of a DC-DC converter according to a second embodiment of the present invention.
Figure 6:
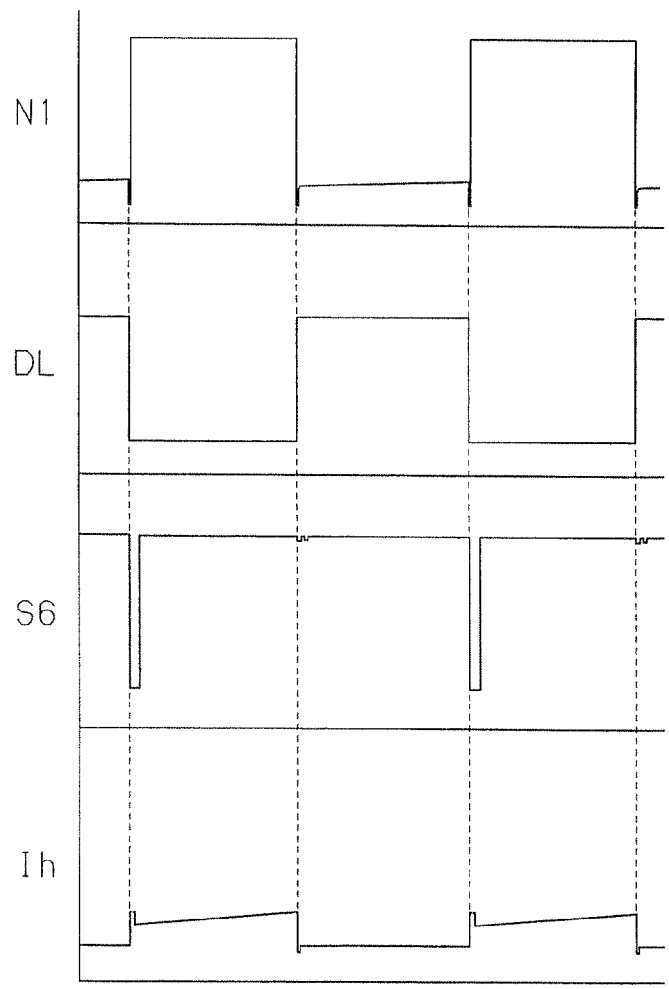
FIG. 6 is a waveform diagram showing the result of an operation simulation of the DC-DC converter of FIG. 2.
Figure 7A:
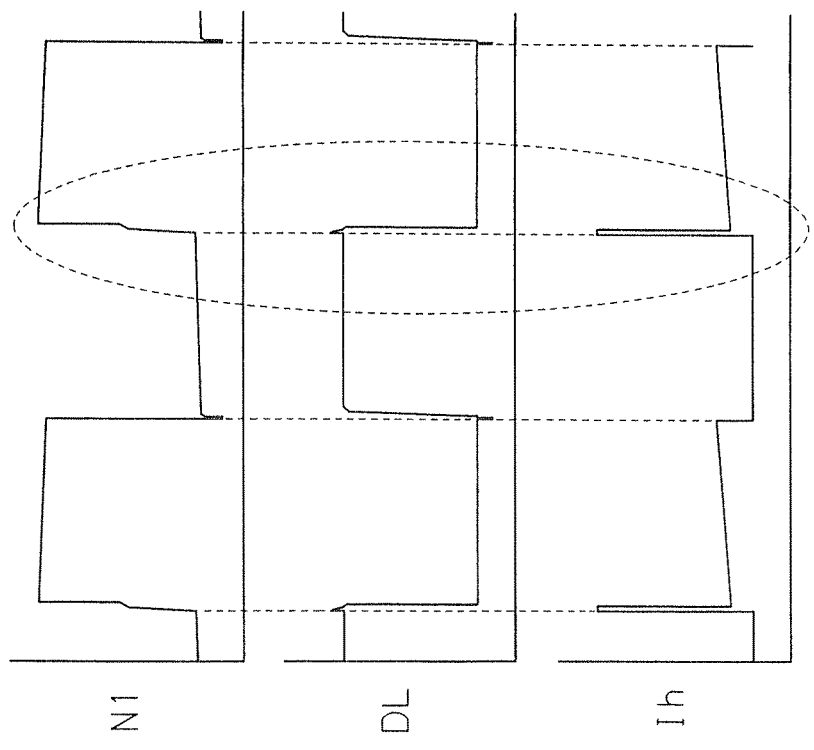
FIG. 7(a) is a waveform diagram showing the result of an operation simulation of a conventional DC-DC converter.
Figure 7B:
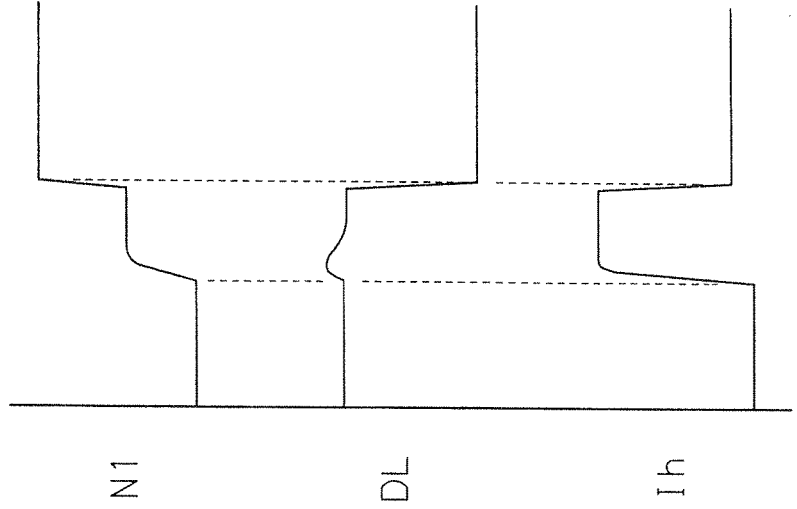
FIG. 7(b) is an enlarged view showing the portion of the operational waveform of FIG. 7(a) encircled by a broken line.

FIG. 6 is a waveform diagram showing the results of operation simulation of the DC-DC converter 10 of FIG. 2. FIG. 7(a) is a waveform diagram showing the result of an operation simulation of a conventional DC-DC converter that does not include the through current prevention pulse generation circuit 27. FIG. 7(b) is an enlarged view of the portion encircled by a broken line in FIG. 7(a).

In the conventional circuit that does not include the through current prevention pulse generation circuit 27, a through current causes an extremely large current Ih to flow through the first MOS transistor T1 when the first MOS transistor T1 is turned on as shown in FIG. 7(a). As shown in FIG. 7(b), the current Ih delays the increase (rise) of the potential at the output node N1 and delays the timing at which the control signal DL, which is provided to the gate of the second MOS transistor T2, falls to an L level. As a result, the current Ih flows until the second MOS transistor T2 is turned off. In the DC-DC converter 10 of FIG. 2, the first MOS transistor T1 is turned on after it is ensured that the second MOS transistor T2 is turned off in response to the second pulse signal S6 as shown in FIG. 6. This prevents a through current from flowing. As a result, a large current does not flow through the first MOS transistor T1.

For example, the input voltage Vi is 5.0 V, the output voltage Vo is 1.2 V, the operational frequency is 2.0 MHz, and the current to be supplied to the load is 600 mA. In such a case, when a through current flows for 10 nsec and the amount of the through current is 4.2 A, a loss caused by the through current is 420 mW. The conversion efficiency of the entire DC-DC converter is 50% when such a through current flows.

The efficiency $\eta 1$ of the switching regulator is expressed as the ratio of the output power to the input power, or $$\eta 1 = \text{output power/input power}$$

The output power is obtained by multiplying the output voltage Vo by the output current IL. The input power is obtained by multiplying the input voltage Vi by the input current Ii. The above expression is transformed into $$\eta 1 = (Vo*IL)/(Vi*Ii)$$

The loss LA of the entire switching regulator is the difference between the input power and the output power. The input power is expressed using the loss LA as $$(Vi*Ii) = (Vo*IL) + LA$$

As a result, the efficiency $\eta 1$ of the switching regulator is expressed as $$\eta 1 = (Vo*IL)/(Vo*IL + LA)$$

The loss LA of the entire DC-DC converter is calculated using the above values as $$0.5 = (1.2 \text{ V} * 600 \text{ mA})/(1.2 \text{ V} * 600 \text{ mA} + LA)$$

$$LA = 720 \text{ mW}$$

Without a loss being caused by a through current, the loss of the entire DC-DC converter is calculated as $$720 \text{ mW} - 420 \text{ mW} = 300 \text{ mW}.$$

As a result, the conversion efficiency of the DC-DC converter in this case is calculated as $$(1.2 \text{ V} * 600 \text{ mA})/(1.2 \text{ V} * 600 \text{ mA} + 300 \text{ mW}) = 70.6\%.$$

In this way, the DC-DC converter 10 of the second embodiment prevents a through current and thereby improves the conversion efficiency from 50% to 70.6%.

When the first MOS transistor T1 is turned off, the energy accumulated in the choke coil L1 is discharged, so that the voltage at the output node N1 becomes a negative voltage. Thus, the comparator 31 generates an H level signal S7. In this state, the signal S6 has an L level. Thus, the AND circuit 30 generates an H level control signal DL. As a result, the second MOS transistor T2 is turned on. The H level signal S7 provided from the comparator 31 includes a delay. The delay is generated after the first MOS transistor T1 is turned off. More specifically, the signal S7 rises to an H level after a predetermined time elapses from when the first MOS transistor T1 is turned off. Thus, the second MOS transistor T2 is turned on after the first MOS transistor T1 is turned off. In other words, the second MOS transistor T2 is turned on while the first MOS transistor T1 and the second MOS transistor T2 are both off.

As described above, the second MOS transistor T2 operates as the ideal diode ID. This reduces voltage drop as compared with a voltage drop that occurs in a semiconductor diode and reduces the loss of the energy accumulated in the choke coil L1. As a result, the conversion efficiency of the DC-DC converter 10 is improved. Further, the second MOS transistor T2 is turned off when the first MOS transistor T1 is switched between on and off. The MOS transistors T1 and T2 are not on at the same time. This prevents a through current from flowing through the MOS transistors T1 and T2.

The DC-DC converter 10 of the second embodiment has the advantages described below.

(1) The DC-DC converter 10 includes the through current prevention pulse generation circuit 27 for generating a pulse signal based on the clock signal CK of the OSC 24. The through current prevention pulse generation circuit 27 generates the pulse signals S5 and S6 for controlling the first and second MOS transistors T1 and T2 and ensures that the second MOS transistor T2 remains off in a predetermined period that begins before the first MOS transistor T1 is turned on and ends after the first MOS transistor T1 is turned on. As a result, the first MOS transistor T1 and the second MOS transistor T2 are not on at the same time. This prevents a through current from flowing.

(2) The comparator 31 detects a current flowing through the choke coil L1 based on the potential difference between the two terminals of the second MOS transistor T2. Then, the comparator 31 turns off the second MOS transistor T2 in accordance with the detection result. The second MOS transistor T2 and the comparator 31 form the ideal diode ID. This reduces the voltage drop as compared with the voltage drop that occurs in a semiconductor diode and reduces the loss of the energy accumulated in the choke coil L1. As a result, the conversion efficiency of the DC-DC converter 10 is improved.

A DC-DC converter 40 according to a third embodiment of the present invention will now be described with reference to the drawings.

Figure 8:
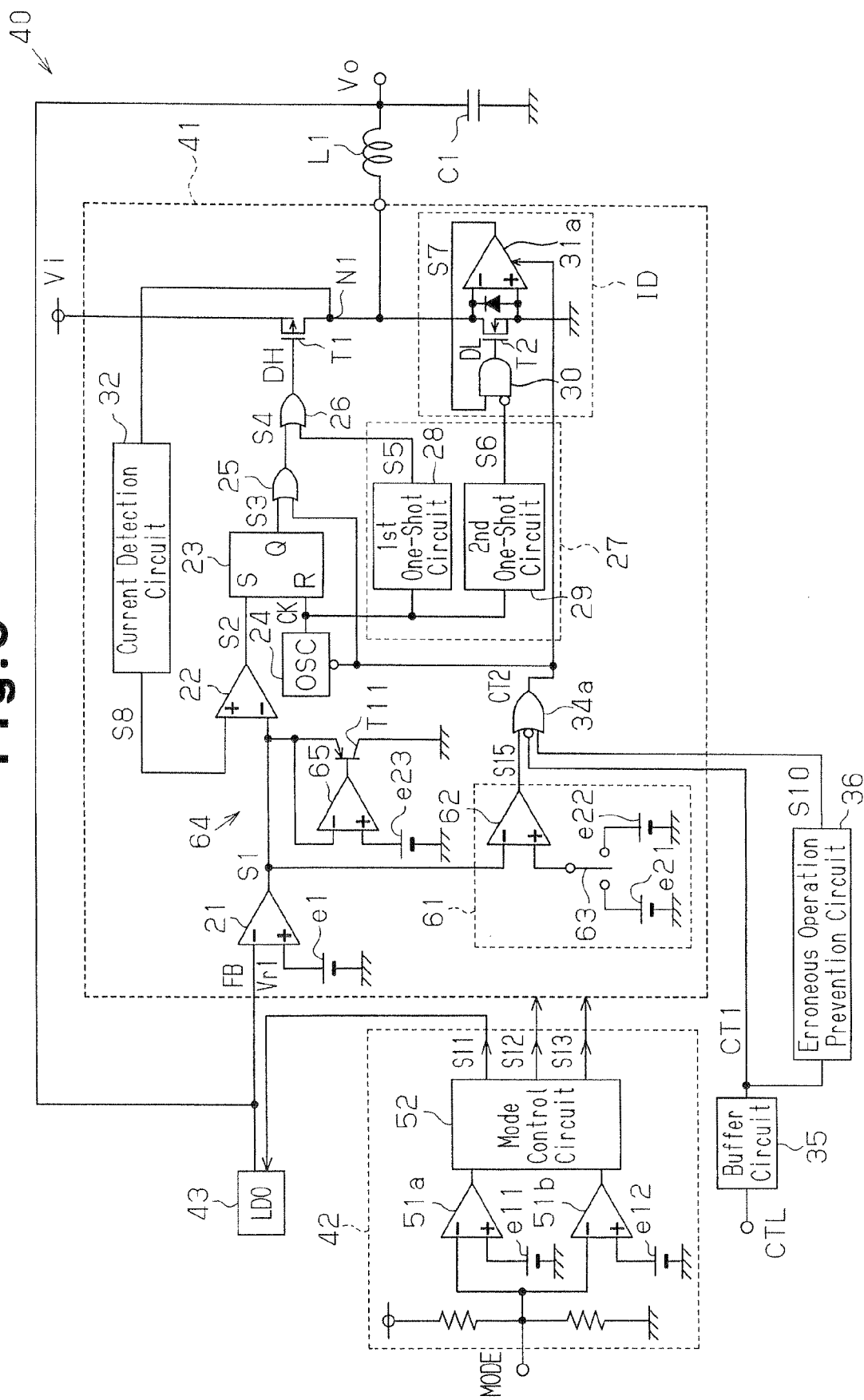
FIG. 8 is a schematic circuit diagram of a DC-DC converter according to a third embodiment of the present invention.

The DC-DC converter 40 of the third embodiment shown in FIG. 8 includes a control circuit 41, a mode selection circuit 42, and a low dropout regulator (LDO) 43. The control circuit 41 converts an input voltage Vi into an output voltage Vo by executing pulse frequency modulation (PFM) control or pulse width modulation (PWM) control. The LDO 43, which is a series regulator or a linear regulator having high conversion efficiency in a low load state, converts the input voltage Vi into the output voltage Vo. The mode selection circuit 42 selects one of the modes of LDO, PFM, and PWM in response to a mode signal MODE and generates a control signal corresponding to each mode. The mode selection circuit 42 includes two comparators 51a and 51b and a mode control circuit 52. A reference power supply e11 is connected to an inversion input terminal of the comparator 51a. A reference power supply e12 is connected to an inversion input terminal of the comparator 51b. The reference power supplies e11 and e12 have different reference voltages. The comparators 51a and 51b, which are window comparators, each generate a signal having a level that is in accordance with the voltage of the mode signal MODE. The mode control circuit 52 generates control signals S11, S12, and S13 respectively corresponding to the three modes based on the output signals of the two comparators 51a and 51b.

The LDO 43 operates in response to the control signal S11 and generates the output voltage Vo. The control circuit 41 performs a PWM operation in response to the control signal S12. The PWM operation is the same as the operation performed by the control circuit 11 of the second embodiment. The control circuit 41 performs a PFM operation in response to the control signal S13. In the PFM operation, the control circuit 41 controls the first output MOS transistor T1 to intermittently switch between on and off. As a result, the conversion efficiency of the DC-DC converter 40 in a low load state is higher in the PFM operation than in the PWM operation.

Figure 9:
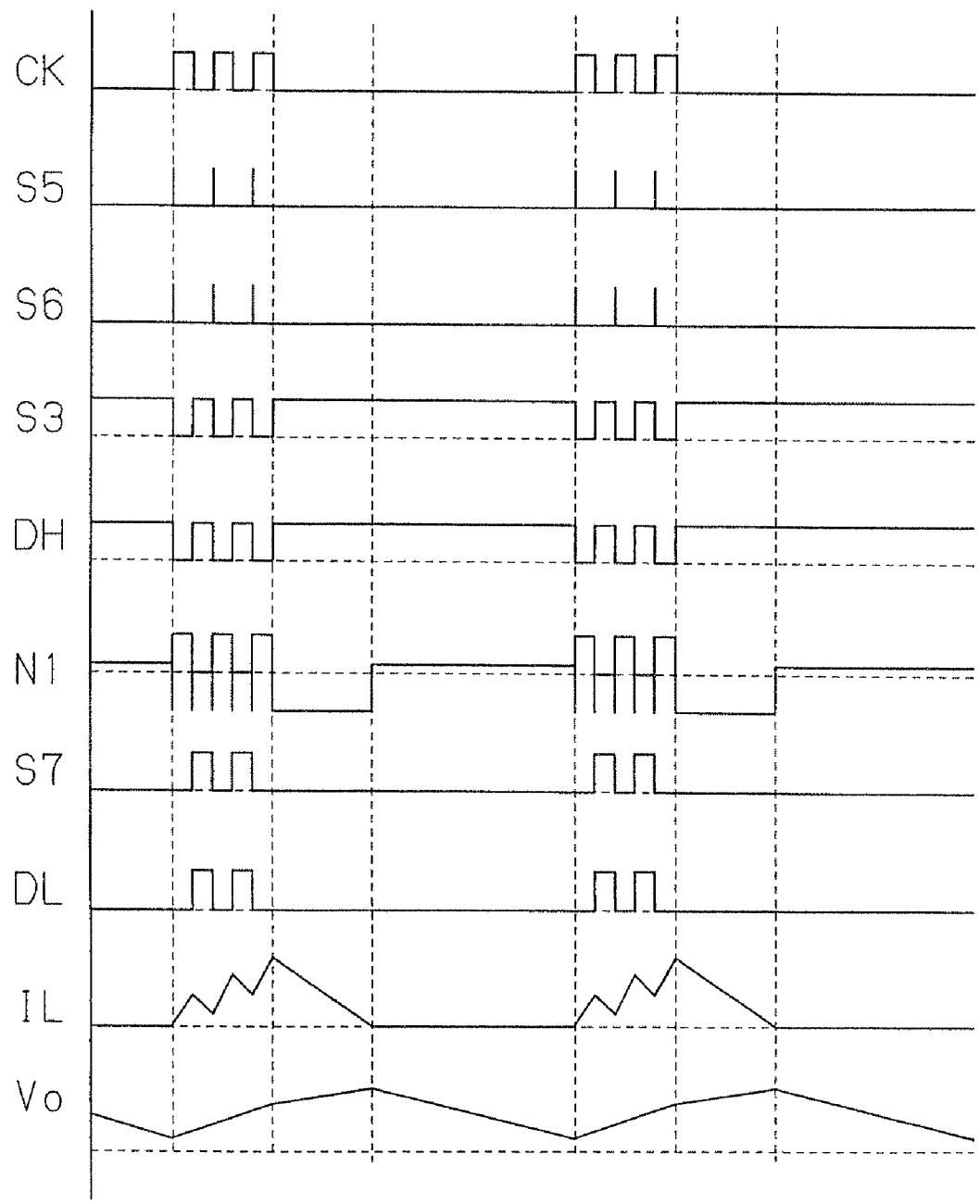
FIG. 9 is an operational waveform diagram of the DC-DC converter of FIG. 8 in a PFM mode when the output voltage is low.
Figure 10:
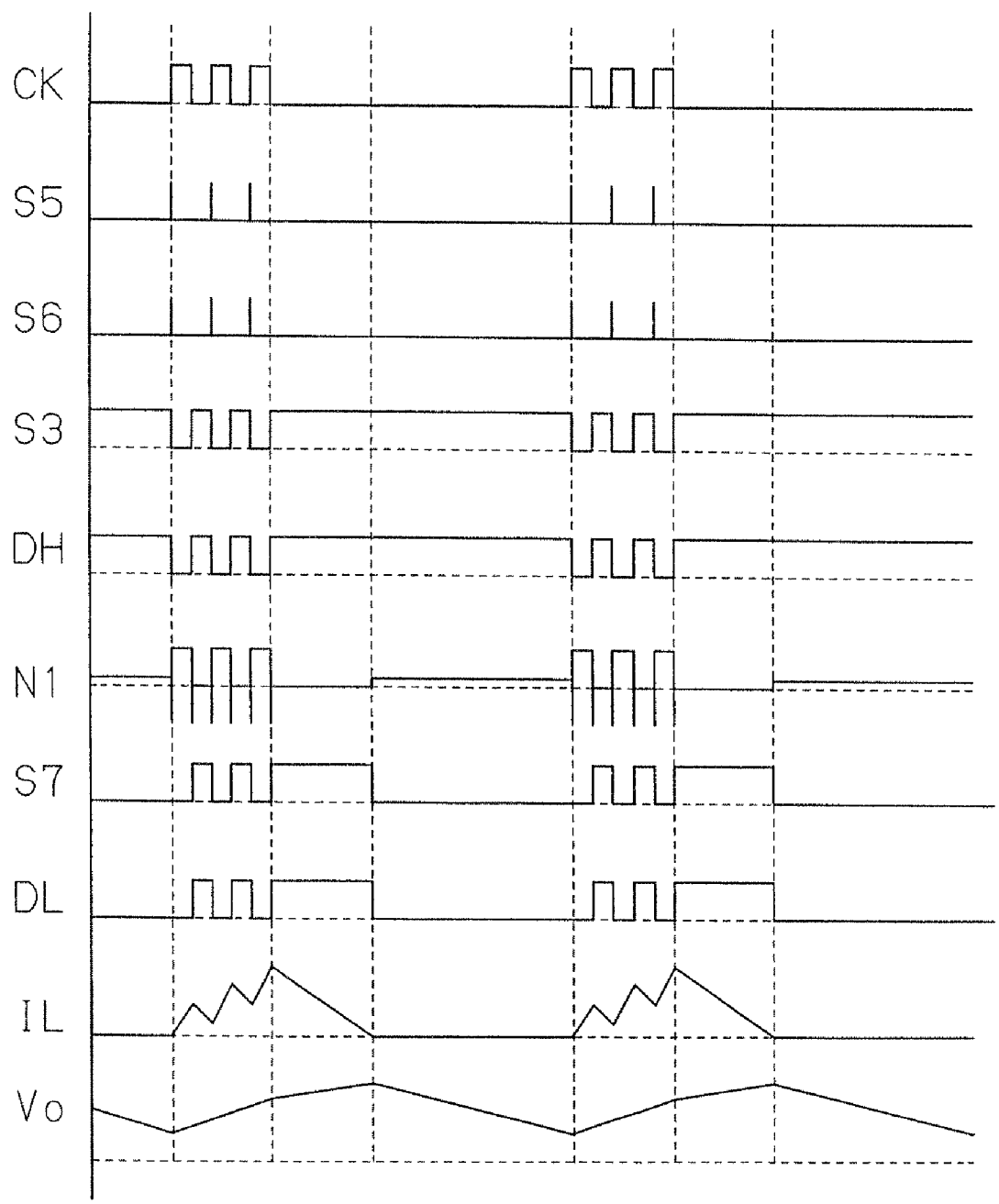
FIG. 10 is an operational waveform diagram of the DC-DC converter of FIG. 8 in the PFM mode when the output voltage is high.

In detail, the control circuit 41 includes an operation stop circuit 61. The operation stop circuit 61 includes a comparator 62, a switch 63, and reference power supplies e21 and e22. An inversion input terminal of the comparator 62 is provided with an output signal S1 of an error amplifier 21, and a non-inversion input terminal of the comparator 62 is connected to a common terminal of the switch 63. The switch 63 has a first terminal connected to the first reference power supply e21 and a second terminal connected to the second reference power supply e22. The voltage of the first reference power supply e21 is set to be higher than the voltage of the second reference power supply e22. The switch 63 supplies the voltage of the second reference power supply e22 to the comparator 62 in response to the control signal S12 indicating the PWM mode. Further, the switch 63 supplies the voltage of the first reference power supply e21 to the comparator 62 in response to the control signal S13 indicating the PFM mode. The comparator 62 always generates an L level signal S15 in the PWM mode. Further, the comparator 62 generates an L level or H level signal S15 in accordance with the output signal S1 of the error amplifier 21, or the output voltage Vo, in the PFM mode. This signal is provided to an OR circuit 34a. The OR circuit 34a generates an operation control signal CT2 based on the signal S15 and signals CT1 and S10. The operation control signal CT2 is set to an L level when an external control signal CTL is at an H level, the signal S15 is at an L level, and the signal S10 is at an L level. An OSC 24 performs an oscillation operation in response to the L level operation control signal CT2 and generates a clock signal CK. The operation control signal CT2 is set to an H level when the external control signal CTL has an H level, the signal S15 has an H level, and the signal S10 has an L level. As a result, the OSC 24 stops operating. As shown in FIGS. 9 and 10, the OSC 24 intermittently generates the clock signal CK in the PFM mode. The control circuit 41 controls the first MOS transistor T1 to intermittently switch between on and off. This prevents the conversion efficiency of the DC-DC converter 40 from decreasing in a low load state.

The operation control signal CT2 of the OR circuit 34a is provided to a comparator 31a, to which a source and a drain of the second MOS transistor T2 are connected. The comparator 31a generates an L level signal S7 in response to an H level operation control signal CT2. As a result, the second MOS transistor T2 is turned off, and the ideal diode ID stops operating. Thus, the power consumption of the DC-DC converter 40 is reduced.

The comparator 31a generates an L level signal S7 in response to an H level operation control signal CT2 when the DC-DC converter 40 is shut down. Further, the potential of the signal S1 is determined by a difference between the voltage of the feedback signal FB (that is, the output voltage Vo) and the reference voltage Vr1 in the PFM operation. An H level signal S15 is generated based on the voltage of the signal S1 and the voltage of the reference power supply e21. As shown in FIG. 9, the operation control signal CT2 is set to an H level and the comparator 31a generates an L level signal S7 when the output voltage Vo (potential at the output node N1) is low. As a result, the second MOS transistor T2 is turned off.

The control circuit 41 includes a voltage limiting circuit 64, which is connected between the error amplifier 21 and the current comparator 22. The voltage limiting circuit 64 includes a comparator 65, a transistor T11, and a reference power supply e23. When the voltage of the signal S1 becomes higher that the voltage of the reference power supply e23, the comparator 65 turns on the transistor T11 and clamps the signal S1 to the voltage of the reference power supply e23.

The DC-DC converter 40 of the third embodiment has the advantages described below.

(1) The comparator 31a for turning the second MOS transistor T2 on and off is provided with the operation control signal CT2 for controlling the operation of the OSC 24. The comparator 31a stops operating (generates an L level signal S7) when the OSC 24 stops operating. The second MOS transistor T2 is turned off in response to the L level signal S7. This reduces the power consumption of the DC-DC converter 40 and prevents the efficiency of the DC-DC converter 40 from decreasing in a low load state.

(2) The mode selection circuit 42 selects one of the operation modes of LDO, PFM, and PWM based on the mode signal MODE. The operation mode of the DC-DC converter 40 is switched in accordance with its load so that the conversion efficiency of the DC-DC converter 40 in a low load state is improved as compared with a DC-DC converter that executes only PWM control.

A DC-DC converter 70 according to a fourth embodiment of the present invention will now be described with reference to FIG. 11.

Figure 11:
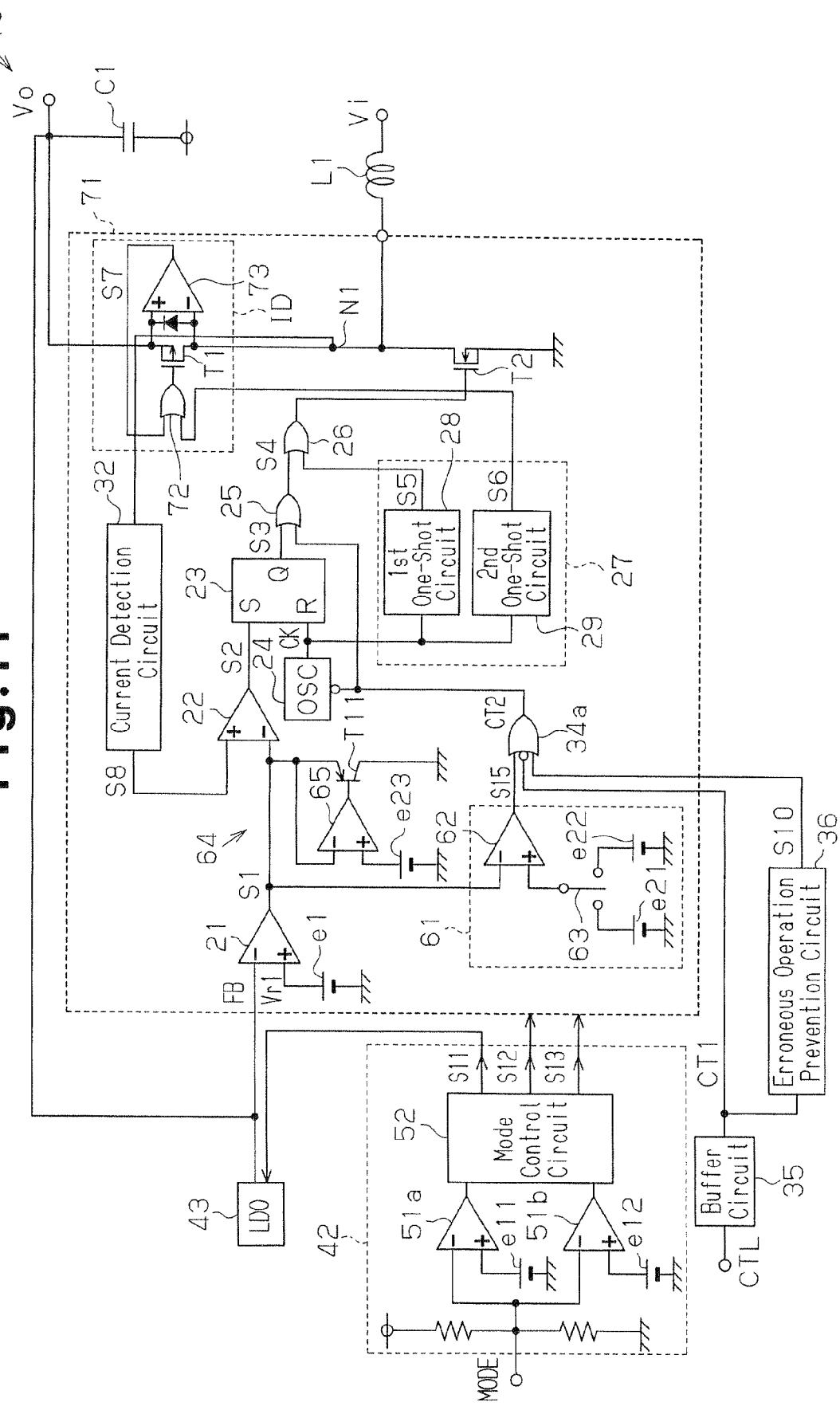
FIG. 11 is a schematic circuit diagram of a DC-DC converter according to a fourth embodiment of the present invention.

The DC-DC converter 70 shown in FIG. 11 is a step-up DC-DC converter. A control circuit 71 of the DC-DC converter 70 includes an OR circuit 72, which serves as a signal synthesizing circuit, and a comparator 73. A first MOS transistor T1, the OR circuit 72, and the comparator 73 form an ideal diode ID. The comparator 73 has a non-inversion input terminal connected to the source of the first MOS transistor T1 and an inversion input terminal connected to a drain of the first MOS transistor T1. An output terminal of the comparator 73 is connected to an input terminal of the OR circuit 72. The OR circuit 72 is provided with a second pulse signal S6. An output terminal of the OR circuit 72 is connected to the gate of the first MOS transistor T1. An output terminal of a driver circuit 26 is connected to the gate of a second MOS transistor T2.

The DC-DC converter 70 of the fourth embodiment has the advantages described below.

(1) The first MOS transistor T1, the comparator 73, and the OR circuit 72 form the ideal circuit ID. This structure reduces the voltage drop as compared with the voltage drop that occurs in a typical semiconductor diode, and reduces the loss of the energy accumulated in the choke coil L1. As a result, the conversion efficiency of the DC-DC converter 70 is improved.

(2) The second MOS transistor T2 is turned on when the first MOS transistor T1 is off. Thus, the MOS transistors T1 and T2 are not on at the same time. This prevents a through current from flowing through the MOS transistors T1 and T2.

Figure 12:
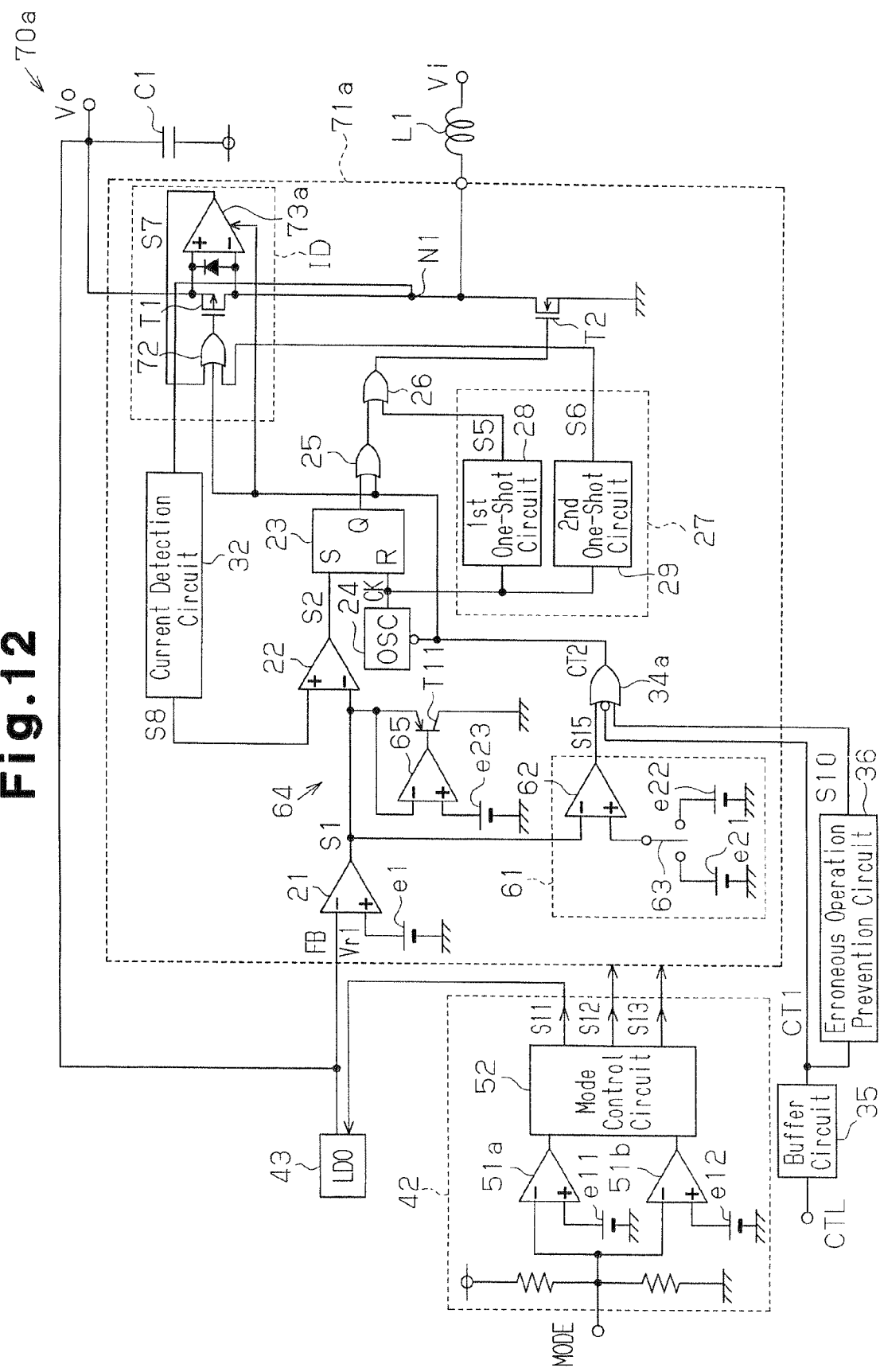
FIG. 12 is a schematic circuit diagram of a DC-DC converter according to a fifth embodiment of the present invention.

FIG. 12 is a schematic circuit diagram of a DC-DC converter 70a according to a fifth embodiment of the present invention.

The DC-DC converter 70a includes a comparator 73a. The comparator 73a is provided with an operation control signal CT2 in the same manner as in the third embodiment. A first MOS transistor T1 stops operating in response to an output signal S7 of the comparator 73a when a second MOS transistor T2 is not turned on or off. As a result, the consumption current of the DC-DC converter 70a is reduced as compared with the DC-DC converter 70 of the fourth embodiment.

Figure 13:
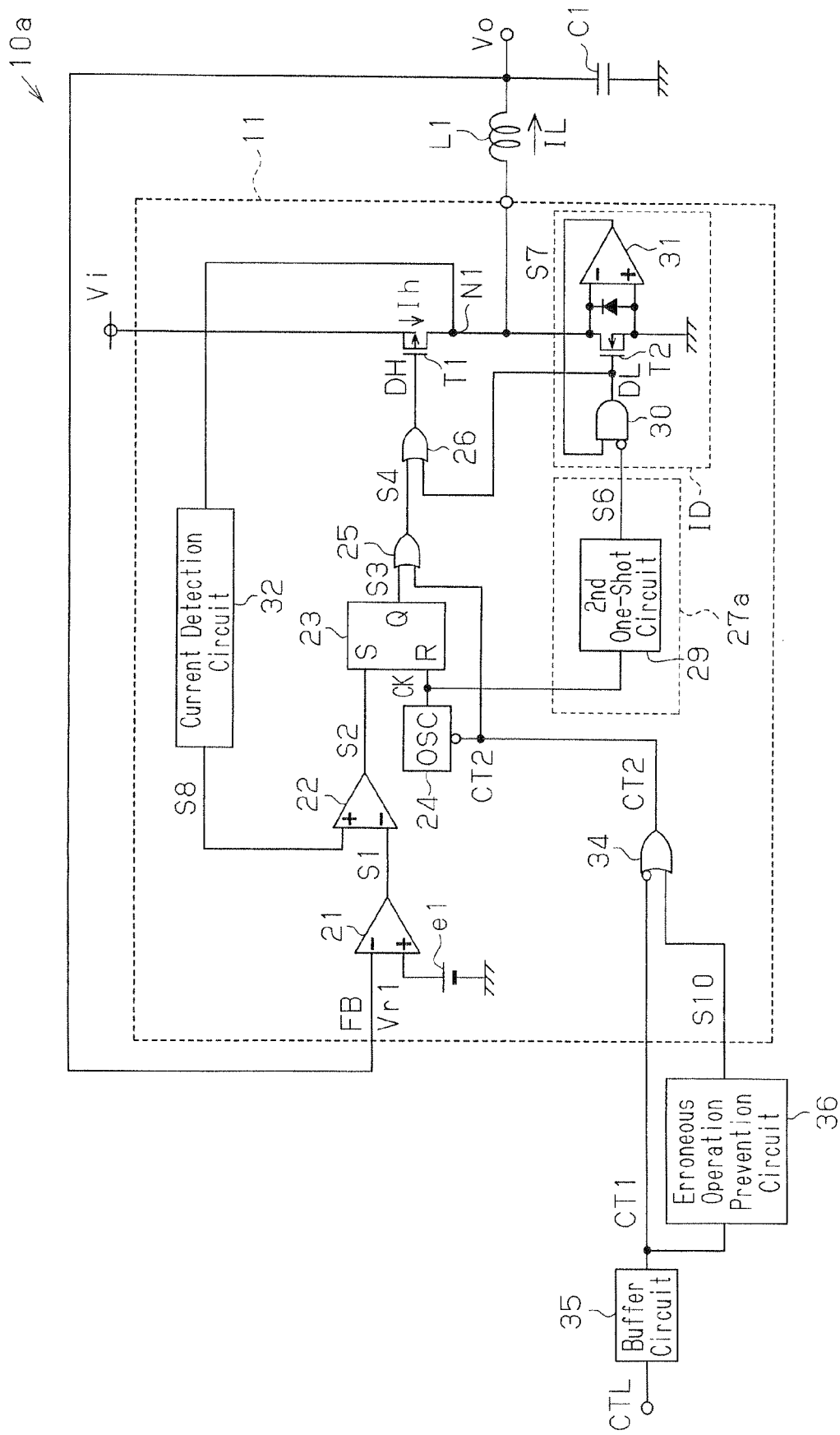
FIG. 13 is a schematic circuit diagram of a DC-DC converter according to a sixth embodiment of the present invention.

FIG. 13 is a schematic circuit diagram of a DC-DC converter 10a according to a sixth embodiment of the present invention.

A through current prevention pulse generation circuit 27a of the DC-DC converter 10a includes a second one-shot circuit 29. A driver circuit 26 is provided with a second control signal DL from an AND circuit 30 instead of the first pulse signal S5 from the first one-shot circuit 28. The driver circuit 26 generates a first control signal DH based on the second control signal DL. More specifically, the driver circuit 26 of the DC-DC converter 10a performs the logical OR operation of the second control signal DL and a signal S4 to generate a first control signal DH indicating the operational result.

In the DC-DC converter 10a, the first control signal DH falls to an L level after the second control signal DL falls to an L level. The first transistor T1 is turned on after it is ensured that the second transistor T2 is turned off. The first and second MOS transistors T1 and T2 are not on at the same time. This prevents a through current from flowing. Further, the DC-DC converter 10a does not include the first one-shot circuit 28. This shortens the period in which the first and second MOS transistors T1 and T2 are both off. Further, the circuit area of the DC-DC converter 10a is reduced as compared with the DC-DC converter 10 of the second embodiment.

Figure 14:
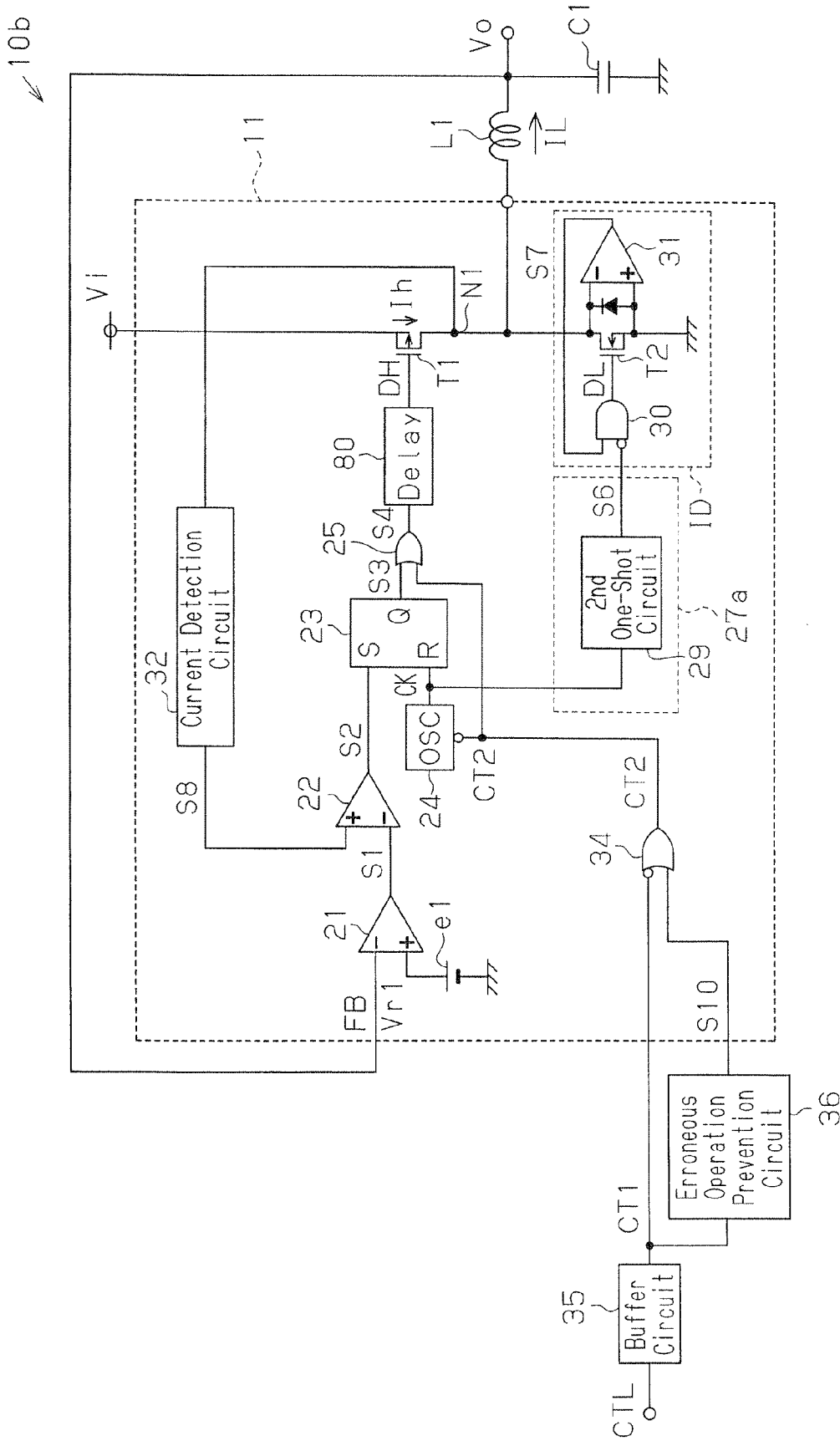
FIG. 14 is a schematic circuit diagram of a DC-DC converter according to a seventh embodiment of the present invention.

FIG. 14 is a schematic circuit diagram of a DC-DC converter 10b according to a seventh embodiment of the present invention.

The DC-DC converter 10b includes a delay circuit 80 in lieu of the driver circuit 26 included in the DC-DC converter 10a of the sixth embodiment (FIG. 13). The delay circuit 80 is provided with a signal S4. An output terminal of the delay circuit 80 is connected to a gate of a first MOS transistor T1. The first MOS transistor T1 is turned on at a timing delayed with respect to the rise of a clock signal CK by a delay time set in the delay circuit 80. A second pulse width of a second pulse signal S6 is set to be greater than a pulse width corresponding to the delay time set in the delay circuit 80. A second one-shot circuit 29 generates an H level second pulse signal S6 in response to a rising edge of the clock signal CK. An AND circuit 30 generates an L level control signal DL in response to the H level second pulse signal S6. A second MOS transistor T2 is turned off in response to the L level control signal DL. The DC-DC converter 10b also prevents a through current from flowing. Further, because the DC-DC converter 10b does not include the first one-shot circuit 28, the circuit area of the DC-DC converter 10b is reduced as compared with the DC-DC converter 10 of the second embodiment.

Figure 15:
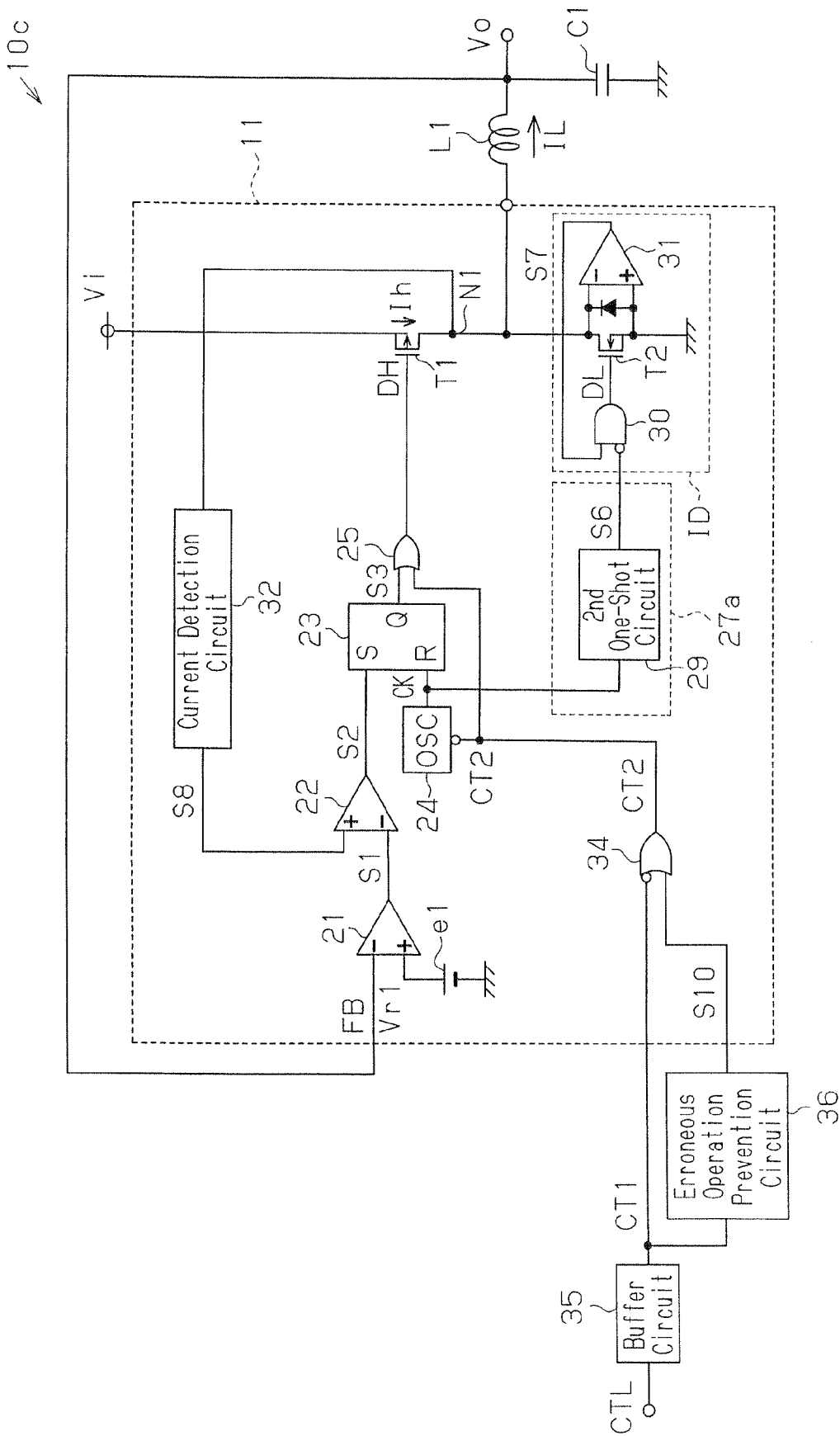
FIG. 15 is a schematic circuit diagram of a DC-DC converter according to an eighth embodiment of the present invention.

FIG. 15 is a schematic circuit diagram of a DC-DC converter 10c according to an eighth embodiment of the present invention.

The DC-DC converter 10c turns a first MOS transistor T1 on and off with the delay produced by at least one of an FF circuit 23 and an OR circuit 25 instead of the first one-shot circuit 28 and the driver circuit 26 included in the DC-DC converter 10 of the second embodiment (refer to FIG. 2). More specifically, the first MOS transistor T1 is turned on at a timing delayed from the rise of a clock signal CK by the time corresponding to the delay produced by at least one of the FF circuit 23 and the OR circuit 25. A second pulse width of a second pulse signal S6 is set to be greater than a pulse width corresponding to the delay of at least one of the FF circuit 23 and the OR circuit 25. The second one-shot circuit 29 generates an H level second pulse signal S6 in response to the rising edge of the clock signal CK. An AND circuit 30 generates an L level control signal DL in response to the H level second pulse signal S6. A second MOS transistor T2 is turned off in response to the L level control signal DL. The DC-DC converter 10c also prevents a through current from flowing. Further, the DC-DC converter 10c does not include the driver circuit 26 and the first one-shot circuit 28. Thus, the circuit area of the DC-DC converter 10c is reduced as compared with the DC-DC converters 10a and 10b of the sixth and seventh embodiments.

Figure 16:
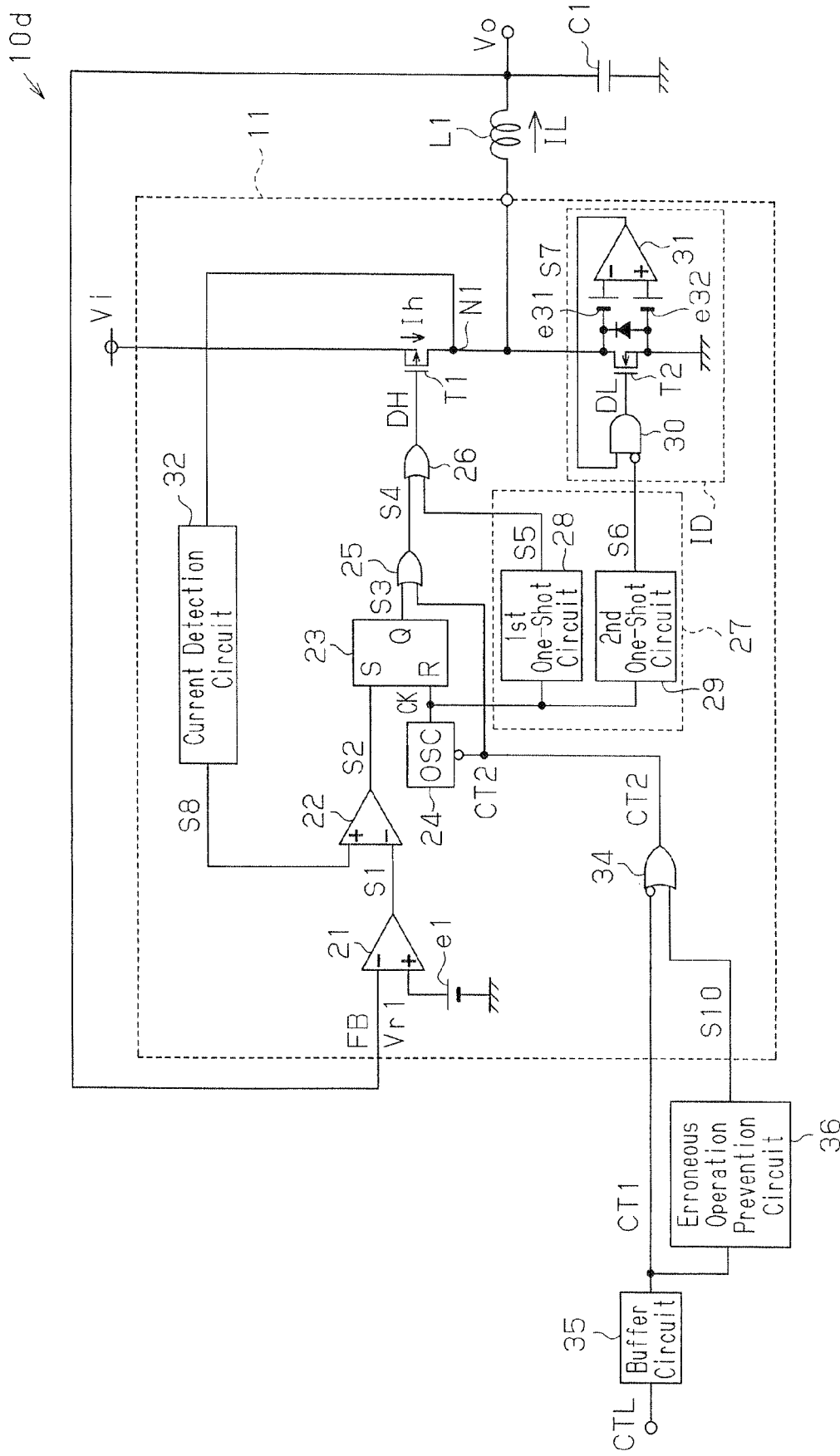
FIG. 16 is a schematic circuit diagram of a DC-DC converter according to a ninth embodiment of the present invention.

FIG. 16 is a schematic circuit diagram of a DC-DC converter 10d according to a ninth embodiment of the present invention.

The ninth embodiment is another form of the ideal diode ID of the DC-DC converter 10 of the second embodiment (refer to FIG. 2). As shown in FIG. 16, an offset is set in a comparator 31 of an ideal diode ID of the DC-DC converter 10d. The offset is set using constant voltage supplies e31 and e32. The offset increases the width of the potential of an input signal, which is used to change the level of an output signal of the comparator 31. More specifically, the offset enables a second transistor T2 to be turned on without delay when a first transistor T1 is switched from an on state to an off state.

The constant voltage supplies e31 and e32 are connected between the second transistor T2 and the comparator 31. The constant voltage supplies e31 and e32 add an offset voltage to each of a drain voltage and a source voltage of the second transistor T2. The voltages to each of which the offset voltage is added are supplied to input terminals of the comparator 31. The comparator 31 generates an output signal in accordance with the voltages supplied to the two input terminals. Further, the comparator 31 changes the level of the output signal in accordance with the voltage obtained by adding the offset voltage to the voltage of one of the two input terminals and in accordance with the voltage of the other one of the two input terminals. In other words, the offset voltage may be generated using one of the constant voltage supplies e31 and e32 in FIG. 16.

Figure 17:
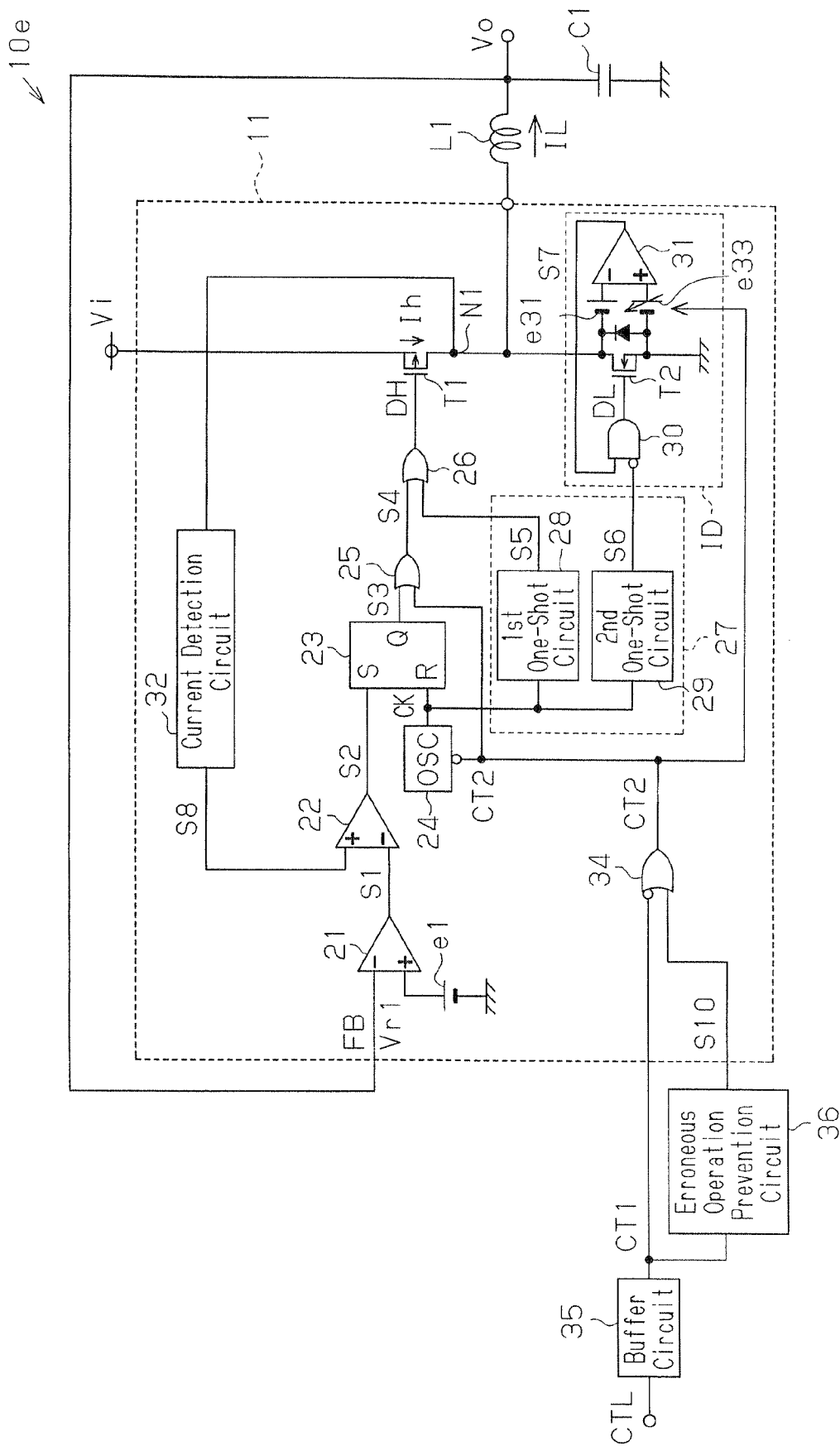
FIG. 17 is a schematic circuit diagram of a DC-DC converter according to a tenth embodiment of the present invention.

FIG. 17 is a schematic circuit diagram of a DC-DC converter 10e according to a tenth embodiment of the present invention.

The DC-DC converter 10e enables the offset voltage set in the comparator 31 of the DC-DC converter 10d of the ninth embodiment (FIG. 16) to be variable. As shown in FIG. 17, a constant voltage supply e31 and a variable power supply e33 are connected between a second transistor T2 and a comparator 31 of the DC-DC converter 10e. The variable power supply e33 varies an offset voltage in response to an operation control signal CT2, which serves as a power down signal.

Figure 18:
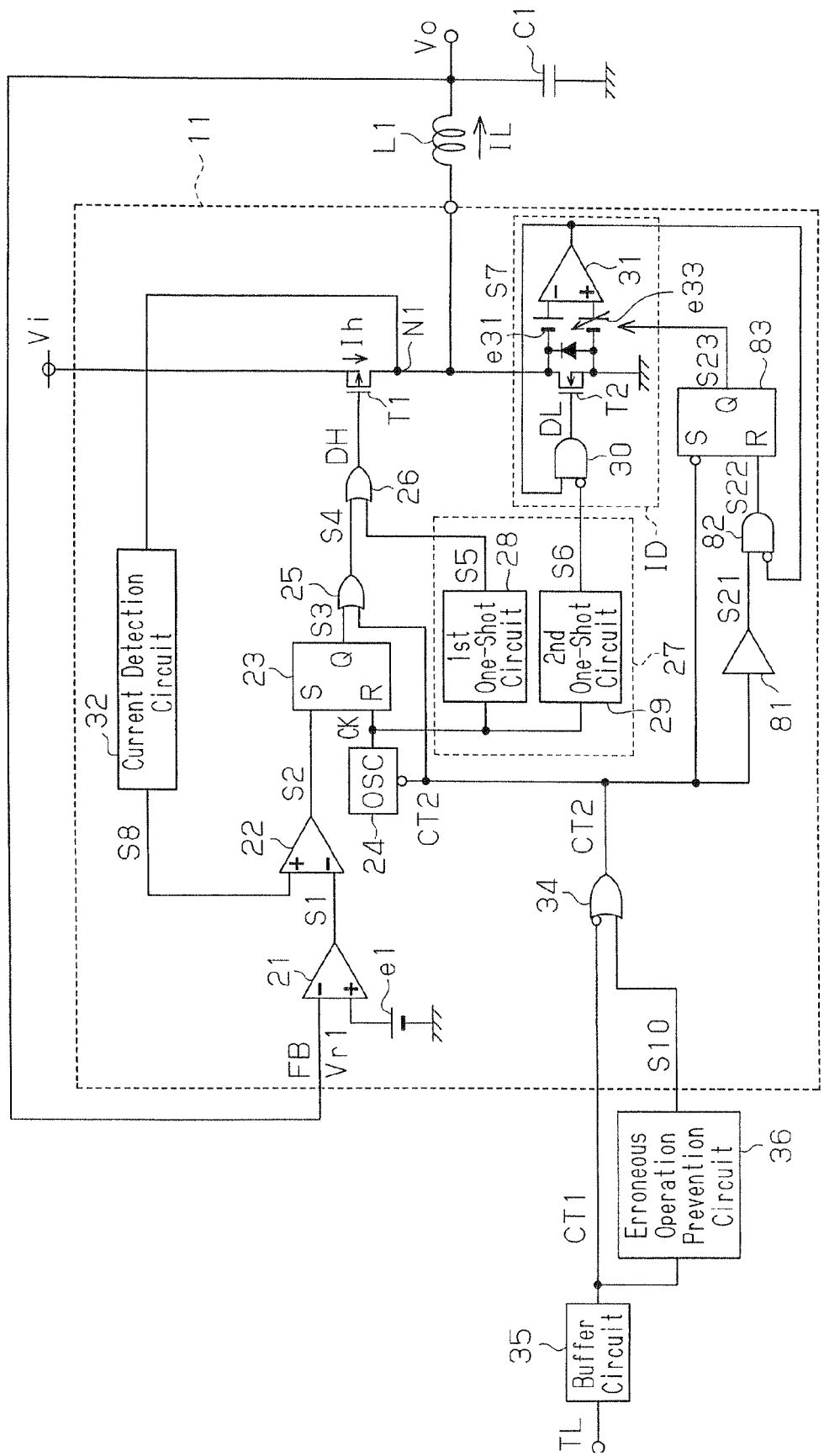
FIG. 18 is a schematic circuit diagram of a DC-DC converter according to an eleventh embodiment of the present invention.

FIG. 18 is a schematic circuit diagram of a DC-DC converter 10f according to an eleventh embodiment of the present invention.

The DC-DC converter 10f has a structure obtained by adding a delay circuit 81, an AND circuit 82, and a FF circuit 83 to the structure of the DC-DC converter 10e in the tenth embodiment (FIG. 17). The delay circuit 81 is provided with an operation control signal CT2. The AND circuit 82 is provided with an output signal S21 (having substantially the same level as the signal CT2) and an output signal S7 of a comparator 31. The AND circuit 82 performs a logical AND operation with an inversion signal of the signal S7 and the signal S21 to generate a signal S22 showing the operational result. As a result, the AND circuit 82 generates an H level signal S22 in response to an L level signal S7 from the comparator 31 and an H level operation control signal CT2. The FF circuit 83 has a set terminal, which is provided with an inversion signal of the operation control signal CT2, and a reset terminal, which is provided with the signal S22. The FF circuit 83 generates an H level signal S23 in response to an L level operation control signal CT2 and generates an L level signal S23 in response to an H level signal S22. A variable power supply e33 varies an offset voltage based on the signal S23.

The above-described structure enables the offset voltage to be set to a first level based on the operation control signal CT2 when the DC-DC converter 10f is powered down. The output signal S7 of the comparator 31 falls to an L level when the delay time set in the delay circuit 81 elapses from when the DC-DC converter 10f recovers to a normal operation from a power down operation. Then, the offset voltage is set to a second level when the second transistor T2 is turned off based on the L level output signal S7. In other words, the offset voltage is set to a second level when the operation of each circuit element of the DC-DC converter 10f is stabilized after the DC-DC converter 10f recovers to the normal operation from the power down operation.

Figure 19:
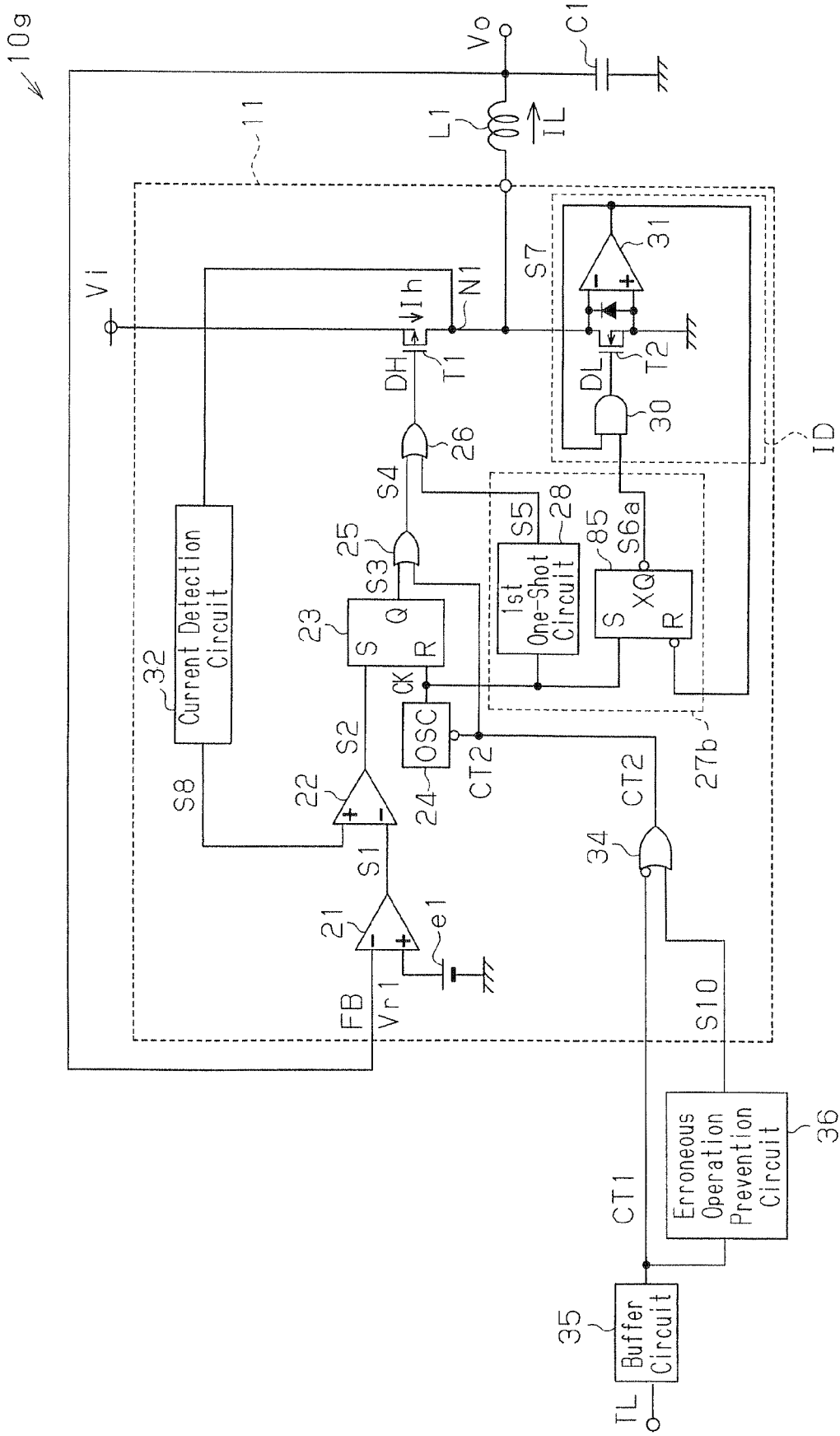
FIG. 19 is a schematic circuit diagram of a DC-DC converter according to a twelfth embodiment of the present invention.

FIG. 19 is a schematic circuit diagram of a DC-DC converter 10g according to a twelfth embodiment of the present invention.

The twelfth embodiment is another form of the through current prevention pulse generation circuit 27 of the DC-DC converter 10 of the second embodiment (refer to FIG. 2). As shown in FIG. 19, a through current prevention pulse generation circuit 27b of the DC-DC converter 10g includes a first one-shot circuit 28 and an RS-FF circuit 85. The FF circuit 85 has a set terminal S provided with a clock signal CK and a reset terminal R provided with an inversion signal of an output signal S7 of a comparator 31. The FF circuit 85 generates a second pulse signal S6a (through current prevention pulse signal) based on the clock signal CK and the signal S7 and outputs the second pulse signal S6a from its inversion output terminal XQ.

In detail, the FF circuit 85 generates an L level second pulse signal S6a in response to an H level clock signal CK. Further, the FF circuit 85 generates an H level second pulse signal S6a in response to an L level signal S7.

Figure 20:
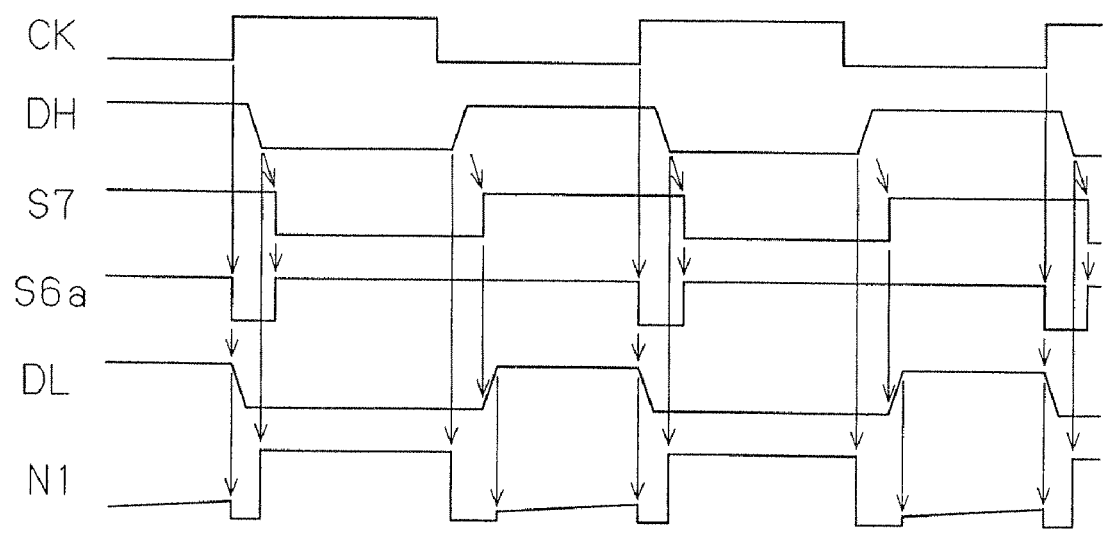
FIG. 20 is an operational waveform diagram of the DC-DC converter of FIG. 19.

In the DC-DC converter 10g, when the first transistor T1 is turned on in response to an L level first control signal DH, the output signal S7 of the comparator 31 falls to an L level as shown in FIG. 20. Then, an output signal S6a of the FF circuit 85 rises to an H level. This keeps the second transistor T2 in an off state. Afterwards, the second transistor T2 is controlled based on the output signal S7 of the comparator 31 without being dependent on the output signal S6a (through current prevention pulse signal) when the first transistor T1 is turned off. This structure reduces the loss that occurs when the first transistor T1 is turned off within a short period.

For example, when the first transistor T1 is turned off within a short period after it is turned on in a low load state, the comparator 31 generates an H level output signal S7 to immediately turn on the second transistor T2. In the second embodiment, the off state of the second transistor T2 is maintained based on an H level second pulse signal S6. In this case, a loss is generated in the body diode. In the twelfth embodiment, the level of the second pulse signal S6a is controlled based on the output signal S7 of the comparator 31. When the first transistor T1 is turned off, the second transistor T2 is controlled based on the output signal S7 of the comparator 31 without being dependent on the second pulse signal S6a.

Figure 21:
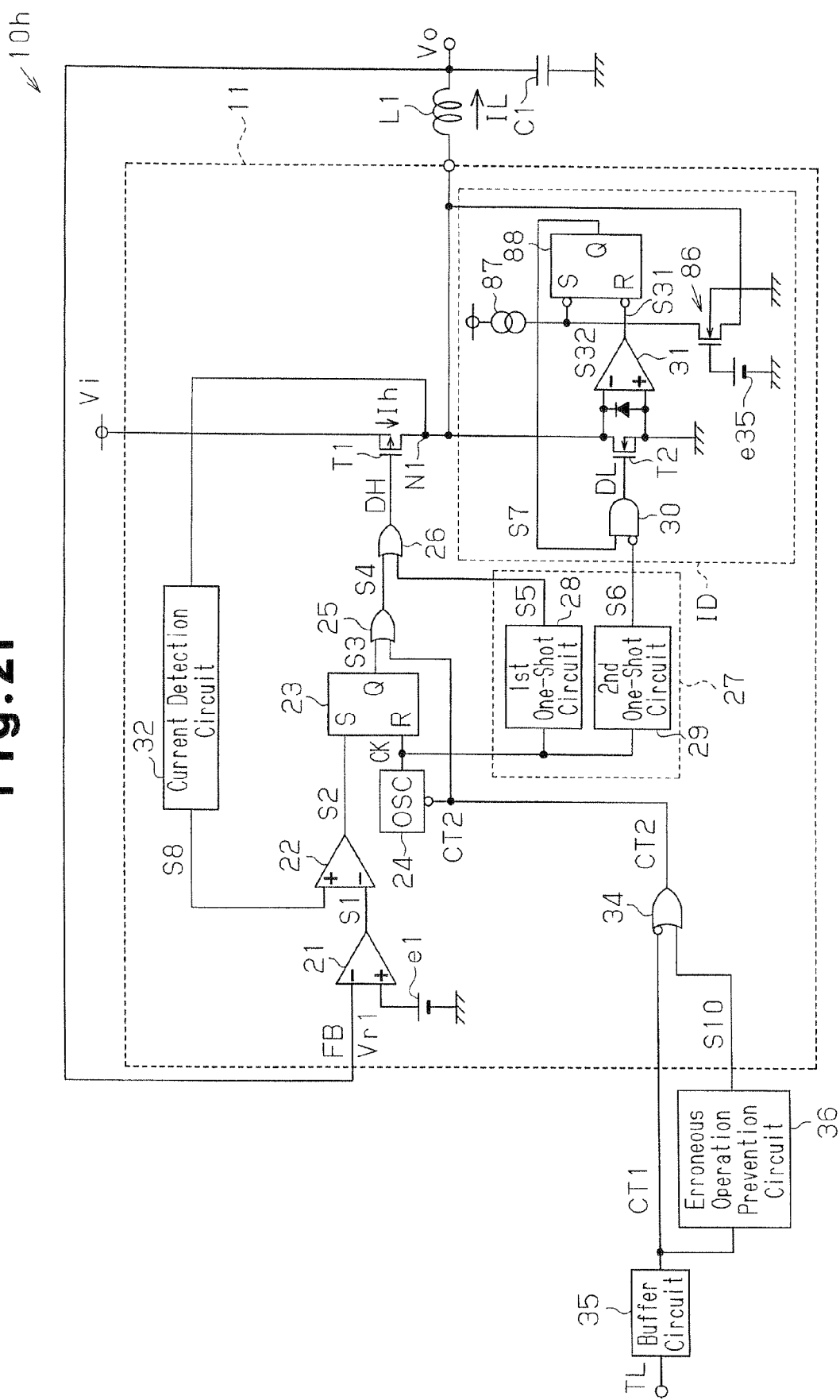
FIG. 21 is a schematic circuit diagram of a DC-DC converter according to a thirteenth embodiment of the present invention.

FIG. 21 is a schematic circuit diagram of a DC-DC converter 10h according to a thirteenth embodiment of the present invention.

The thirteenth embodiment is another form of the ideal diode ID of the DC-DC converter 10 in the second embodiment (refer to FIG. 2). As shown in FIG. 21, an ideal diode ID of the DC-DC converter 10h includes a first comparator 31, a second comparator 86, a constant current supply 87, and an RS-FF circuit 88. The second comparator 86 is formed by an N-channel MOS transistor. The second comparator 86 (N-channel MOS transistor) has a first terminal (e.g., source) connected to a node N1 between a first transistor T1 and a second transistor T2, a second terminal (e.g., drain) connected to the constant current supply 87, and a control terminal (gate) connected to a voltage supply e35. The voltage supply e35 supplies voltage, which is slightly lower than a threshold voltage of a transistor (second comparator 86), to a gate of the transistor. In detail, the voltage supply e35 supplies voltage, which is slightly lower than the level of the potential detected by the first comparator 31, to the gate of the transistor (second comparator 86). A node between the second comparator 86 and the constant current supply 87 is connected to a set terminal S of the FF circuit 88. An output terminal of the first comparator 31 is connected to a reset terminal R of the FF circuit 88. The FF circuit 88 outputs a signal S7a from its non-inversion output terminal Q.

The first comparator 31 detects the current flowing through a choke coil L1 based on the potential difference between the two terminals of the second transistor T2 to generate a signal S31 for turning the second transistor T2 on and off. The second comparator 86 detects an off state of the first transistor T1 based on the potential at the node N1 to generate a signal S32 for turning the second transistor T2 on or off. More specifically, the on and off states of the second transistor T2 are controlled by the first comparator 31 and the second comparator 86. The first comparator 31 accurately detects the current flowing through the choke coil L1. The second comparator 86 responds promptly to a change in the potential at the output node N1. The ideal diode ID enables accurate detection of a current flowing through the choke coil L1 and prevents the efficiency of the DC-DC converter 10h from decreasing. Further, the off state of the first transistor T1 is promptly detected. This reduces loss in a body diode of the second transistor T2.

Figure 22:
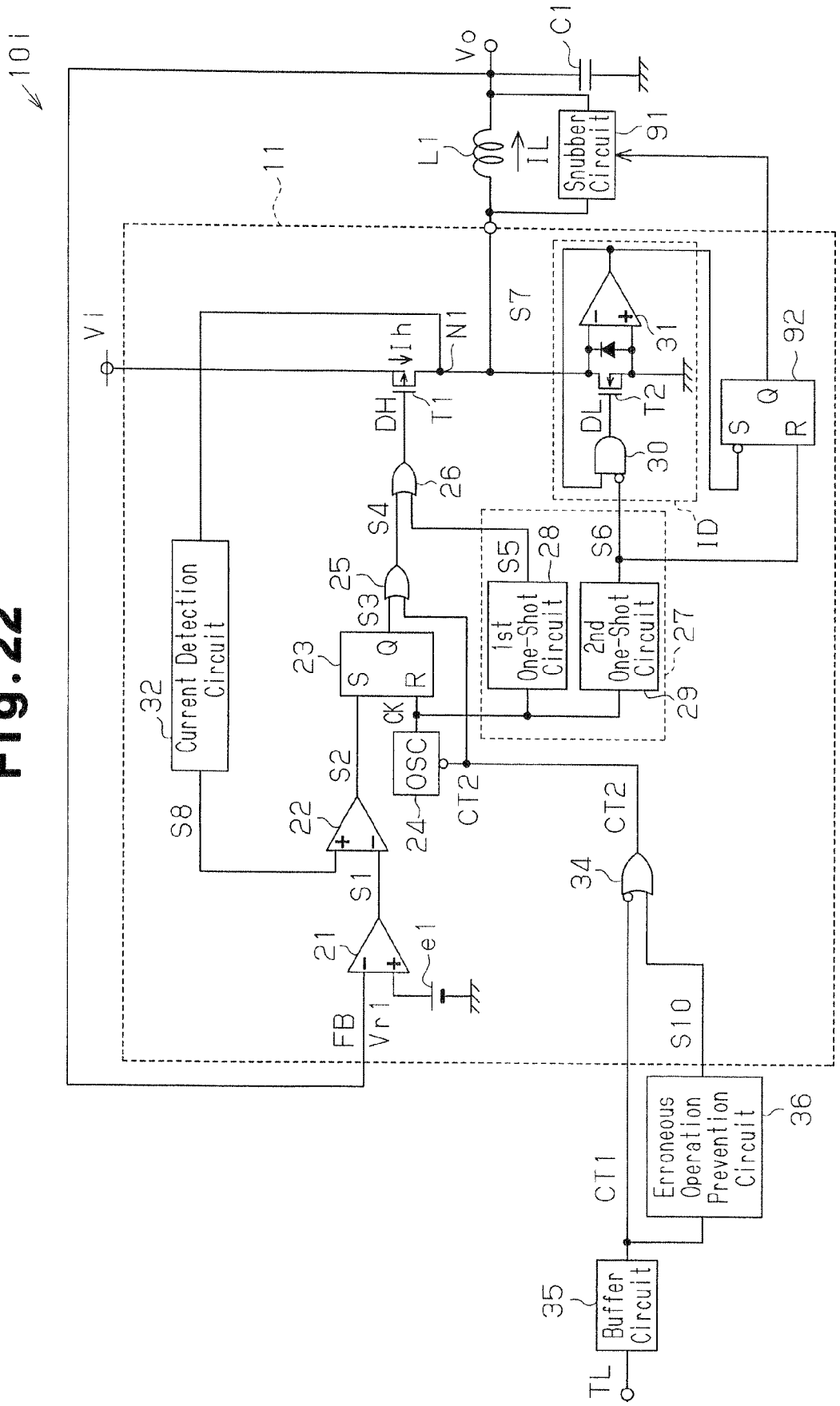
FIG. 22 is a schematic circuit diagram of a DC-DC converter according to a fourteenth embodiment of the present invention.

FIG. 22 is a schematic circuit diagram of a DC-DC converter 10i according to a fourteenth embodiment of the present invention.

The DC-DC converter 10i has a structure obtained by adding a snubber circuit 91 and an RS-FF circuit 92 to the structure of the DC-DC converter 10 of the second embodiment (refer to FIG. 2). The snubber circuit 91 is connected in parallel with a choke coil L1. The snubber circuit 91 is turned on and off in response to a control signal output to a non-inversion output terminal Q of the FF circuit 92. The FF circuit 92 has a set terminal S provided with an inversion signal of an output signal S7 of a comparator 31 and a reset terminal R provided with a second pulse signal S6. The FF circuit 92 generates an H level control signal in response to an L level signal S7 and generates an L level control signal in response to an H level second pulse signal S6. In the DC-DC converter 10i, the snubber circuit 91 is turned on when a first transistor T1 and a second transistor T2 are both turned off during a discontinuous mode (DCM) in a low load state. This reduces resonance, or ringing, that occurs in the DC-DC converter 10i.

Figure 23:
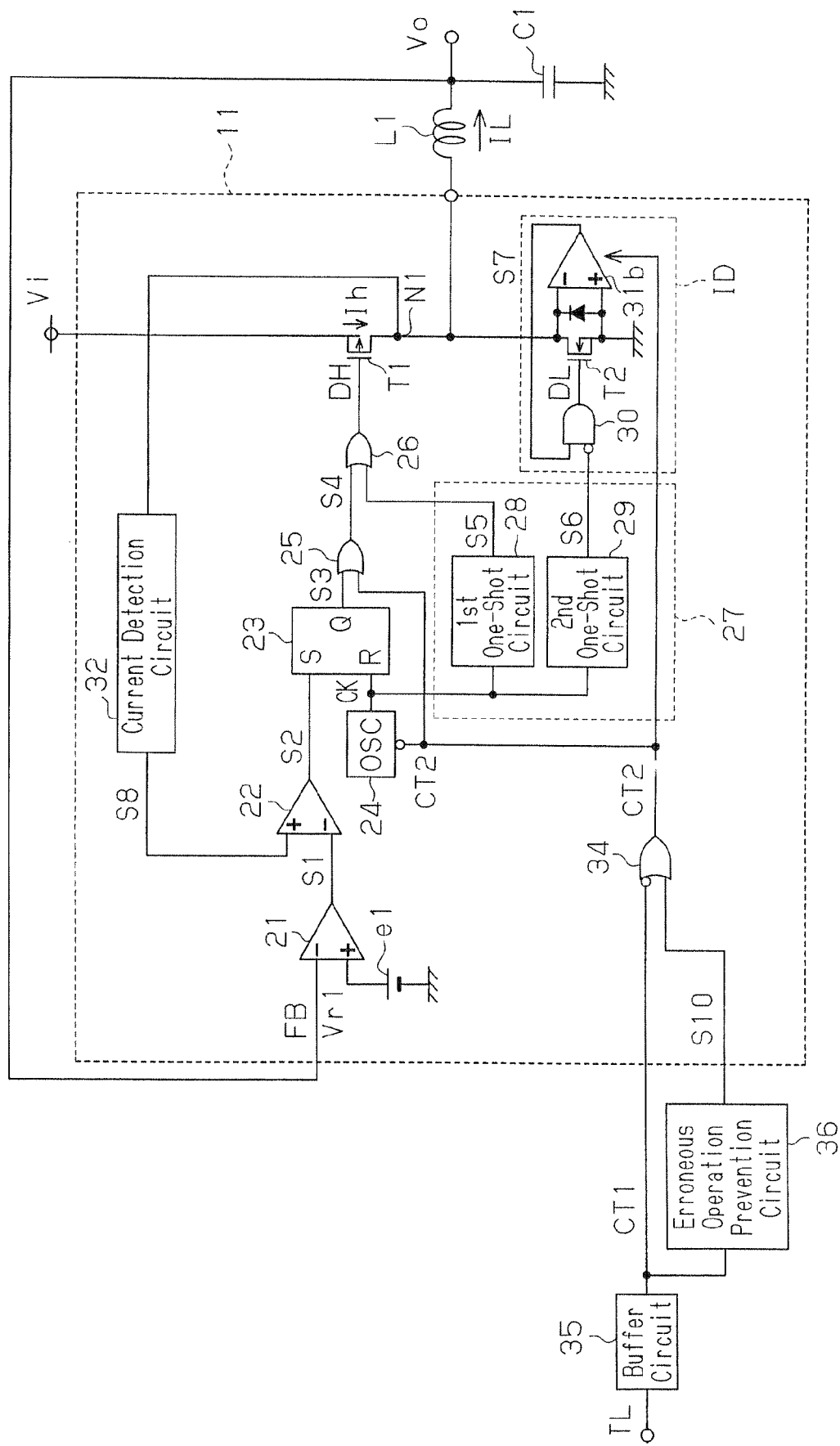
FIG. 23 is a schematic circuit diagram of a DC-DC converter according to a fifteenth embodiment of the present invention.

FIG. 23 is a schematic circuit diagram of a DC-DC converter 10j according to a fifteenth embodiment of the present invention.

The fifteenth embodiment relates to another form of the comparator 31a of the DC-DC converter 40 of the third embodiment (refer to FIG. 8) and the comparator 73a of the DC-DC converter 70a of the fifth embodiment (refer to FIG. 12).

Figure 24:
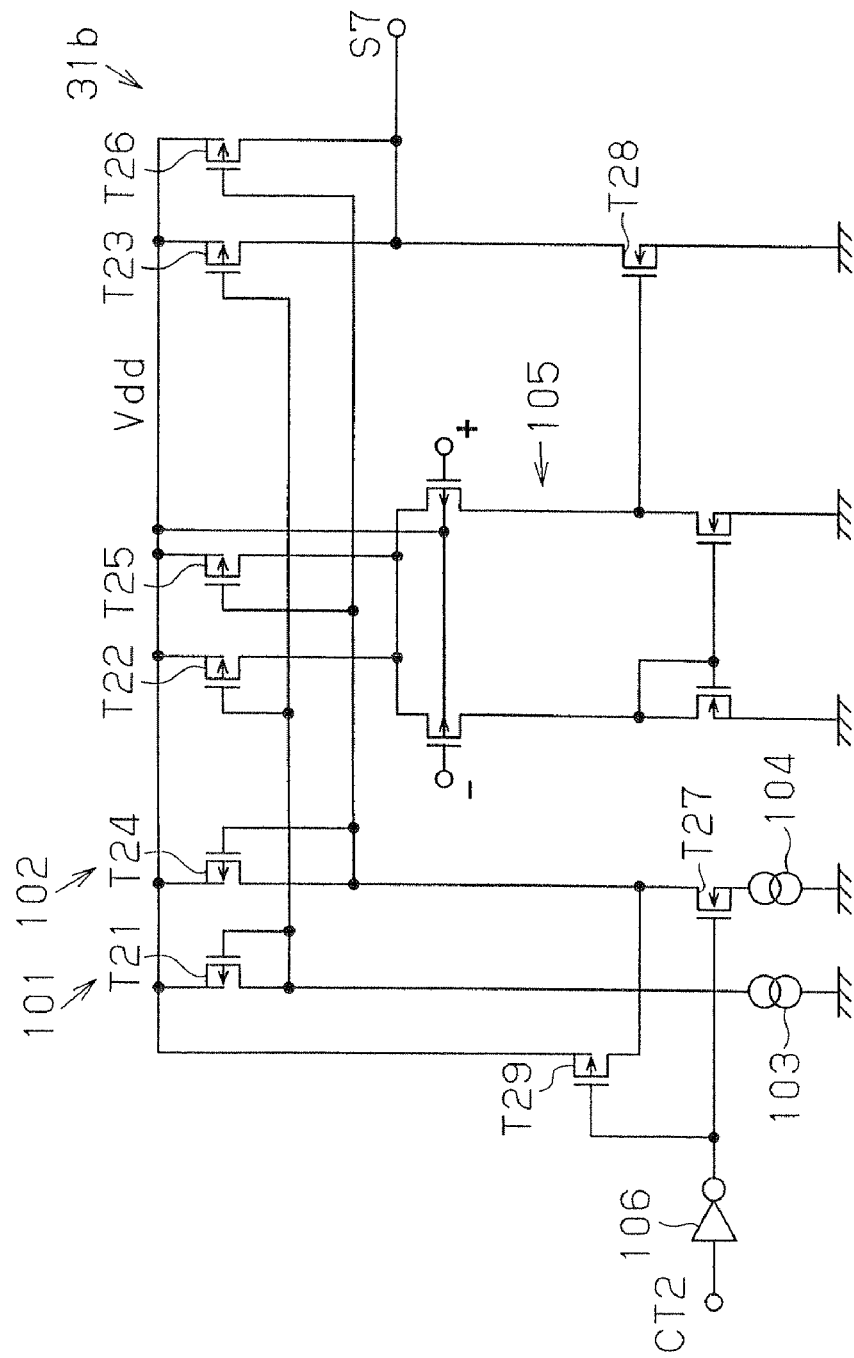
FIG. 24 is a schematic circuit diagram of a comparator included in the DC-DC converter of FIG. 23.

FIG. 24 is a schematic circuit diagram of a comparator 31b included in the DC-DC converter 10j of FIG. 23. The comparator 31b includes a first current mirror 101 and a second current mirror 102, each of which is connected to a high-potential power supply Vdd. The first current mirror 101 is formed by first to third transistors T21, T22, and T23. The second current mirror 102 is formed by fourth to sixth transistors T24, T25, and T26. The drain of the first transistor T21 is connected to a first constant current supply 103. The fourth transistor T24 is connected to a second constant current supply 104 via a seventh transistor T27. The seventh transistor T27 is formed by an N-channel MOS transistor. The first constant current supply 103 and the second constant current supply 104 have the same structure. The fourth to sixth transistors T24, T25, and T26 have their gates connected to the drain of the seventh transistor T27. The second transistor T22 and the fifth transistor T25 have their drains connected to a differential amplification unit 105. The third transistor T23 and the sixth transistor T26 have their drains connected to an eighth output transistor T28. A ninth transistor T29, which is formed by a P-channel MOS transistor, is connected between the sources and the gates of the fourth to sixth transistors T24, T25, and T26. The seventh transistor T27 and the ninth transistor T29 have their gates provided with an operation control signal CT2 via an inverter 106.

In the above-described structure, the seventh transistor T27 is turned on and the second current mirror 102 is connected to the second constant current supply 104 when the operation control signal CT2 has an L level. As a result, the ninth transistor T29 is turned off, and a current generated using the first constant current supply 103 and the second constant current supply 104 flows through the differential amplification unit 105 and the eighth transistor T28.

When the operation control signal CT2 has an H level, the seventh transistor T27 is turned off and the second current mirror 102 is disconnected from the second constant current supply 104. As a result, the ninth transistor T29 is turned on, and the sources and the gates of the fourth to sixth transistors T24, T25, and T26 are short-circuited. In this case, the current generated with the first constant current supply 103 flows through the differential amplification unit 105 and the eighth transistor T28.

The operation control signal CT2 is set at an H level during a power down operation of the DC-DC converter 10j and set at an L level during a normal operation of the DC-DC converter 10j. The amount of current in the comparator 31b in the power down operation is set to about half the current amount in the normal operation. In other words, the amount of current that is half the amount in the normal operation is supplied to the differential amplification unit 105 and the output transistor T28 in the power down operation. As a result, the output level of the comparator 31b is maintained. The structure of the DC-DC converter 10j improves response for shifting from the power down operation to the normal operation as compared with the structure in which the comparator is stopped. In FIG. 24, the current amount may be changed by switching using the second current mirror 102 and the second constant current supply 104.

Figure 25:
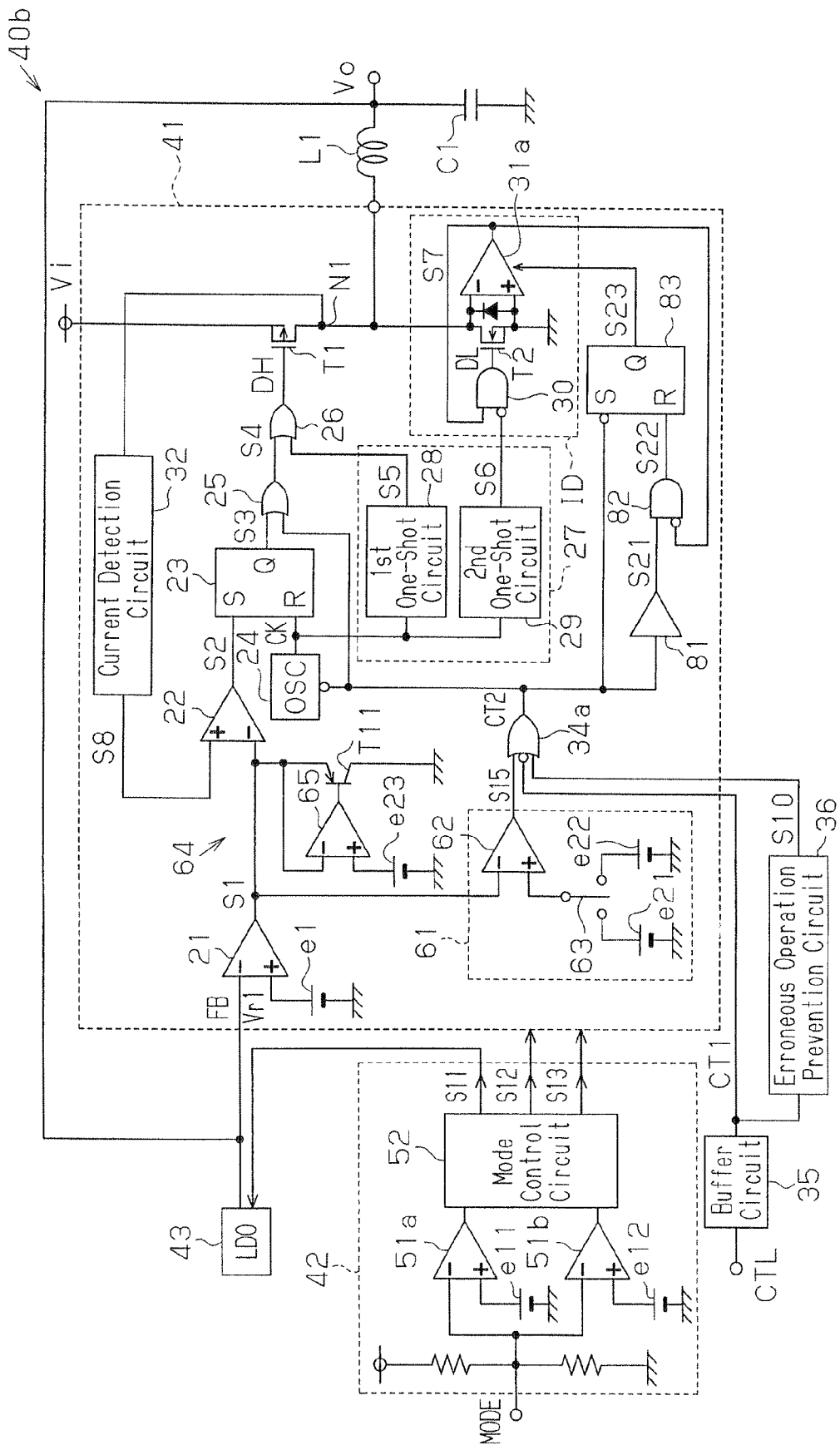
FIG. 25 is a schematic circuit diagram of a DC-DC converter according to a sixteenth embodiment of the present invention.

FIG. 25 is a schematic circuit diagram of a DC-DC converter 40b according to a sixteenth embodiment of the present invention.

The sixteenth embodiment is another form of the DC-DC converter 40 of the third embodiment (refer to FIG. 8). As shown in FIG. 25, in the DC-DC converter 40b, a signal S23 is generated based on an output signal S7 of a comparator 31a and an operation control signal CT2, and the operation of the comparator 31a is controlled based on the signal S23.

In detail, the DC-DC converter 40b includes a delay circuit 81, an AND circuit 82, and an RS-FF circuit 83 in the same manner as the DC-DC converter 10f shown in FIG. 18. The DC-DC converter 40b fixes the output level of the FF circuit 83 when the output signal S7 of the comparator 31a has an L level. With this structure, when an H level operation control signal CT2 is input while the second transistor T2 is on, the second transistor T2 is turned off based on the output signal S7 of the comparator 31a, which detects the current amount. This reduces the loss of the energy accumulated in a choke coil L1.

A voltage controlled step-down DC-DC converter will now be described.

Figure 26:
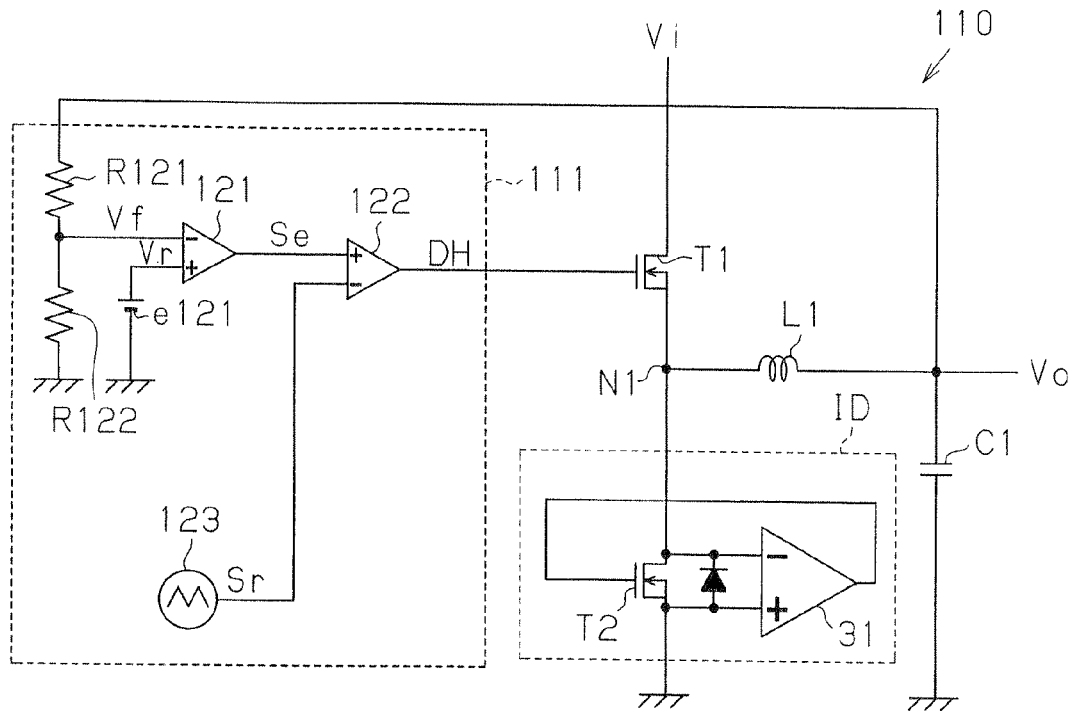
FIG. 26 is a schematic circuit diagram of a conventional voltage controlled step-down DC-DC converter.

FIG. 26 is a schematic circuit diagram of a conventional voltage controlled step-down DC-DC converter 110. The DC-DC converter 110 includes a control circuit 111, a first transistor T1, a choke coil L1, a smoothing capacitor C1, and an ideal diode ID. The ideal diode ID includes a second transistor T2, which is connected in series to the first transistor T1, and a comparator 31. The comparator 31 has input terminals, which are connected to the source and drain of the second transistor T2, and an output terminal, which is connected to the gate of the second transistor T2.

The control circuit 111 includes resistors R121 and R122, an error amplifier 121, a PWM comparator 122, and an OSC 123. The resistors R121 and R122 generate a partial voltage Vf by dividing an output voltage Vo. The error amplifier 121 amplifies the difference between the partial voltage Vf and a reference voltage Vr to generate an error signal Se having the amplified potential. The reference voltage Vr is set to coincide with the partial voltage Vf when the output voltage Vo reaches a specified value.

Figure 27:
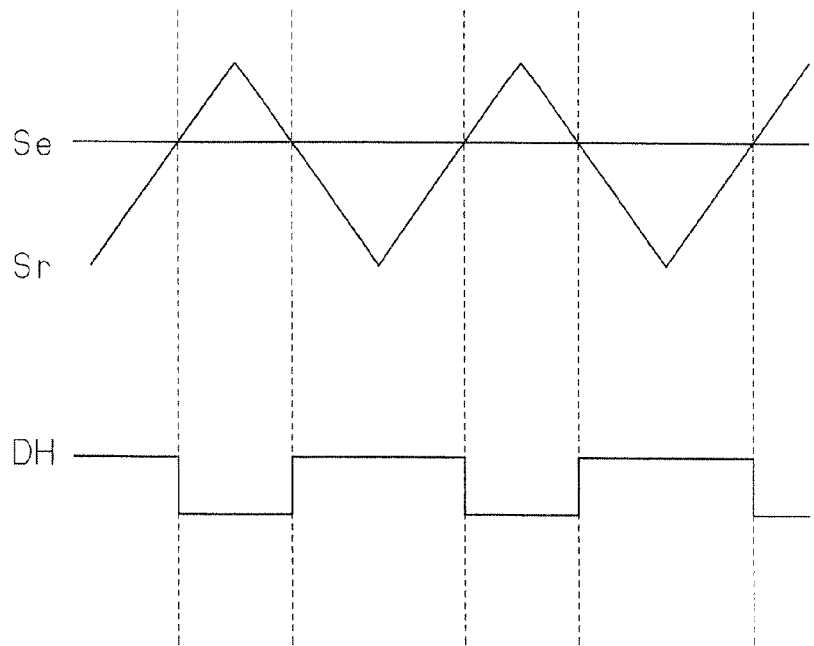
FIG. 27 is an operational waveform diagram of the DC-DC converter of FIG. 26.

The PWM comparator 122 is provided with an error signal Se and a triangular wave signal Sr. The triangular wave signal Sr is generated by the OSC 123. The OSC 123 generates the triangular wave signal Sr having a constant frequency. The PWM comparator 122 compares the error signal Se with the triangular wave signal Sr to generate an H level first control signal DH when the voltage of the error signal Se is higher than the voltage of the triangular wave signal Sr. Further, the PWM comparator 122 generates an L level first control signal DH when the voltage of the error signal Se is lower than the voltage of the triangular wave signal Sr. As shown in FIG. 27, the triangular wave signal Sr has a triangular shape and a predetermined frequency. The potential of the error signal Se corresponds to the difference between the partial voltage Vf and the reference voltage Vr. Thus, the first control signal DH generated by the PWM comparator 122 has a pulse width that is in accordance with the difference between the output voltage Vo and the reference voltage Vr.

Figure 28:
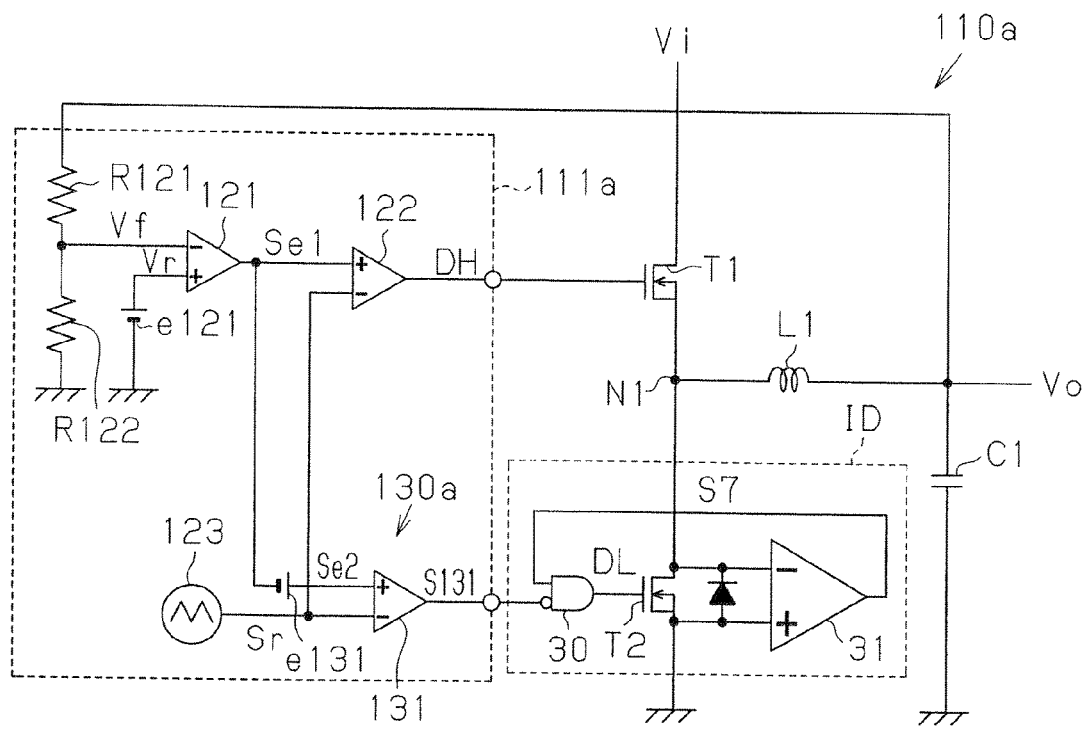
FIG. 28 is a schematic circuit diagram of a DC-DC converter according to a seventeenth embodiment of the present invention.

FIG. 28 is a schematic circuit diagram of a DC-DC converter 110a according to a seventeenth embodiment of the present invention.

Figure 29:
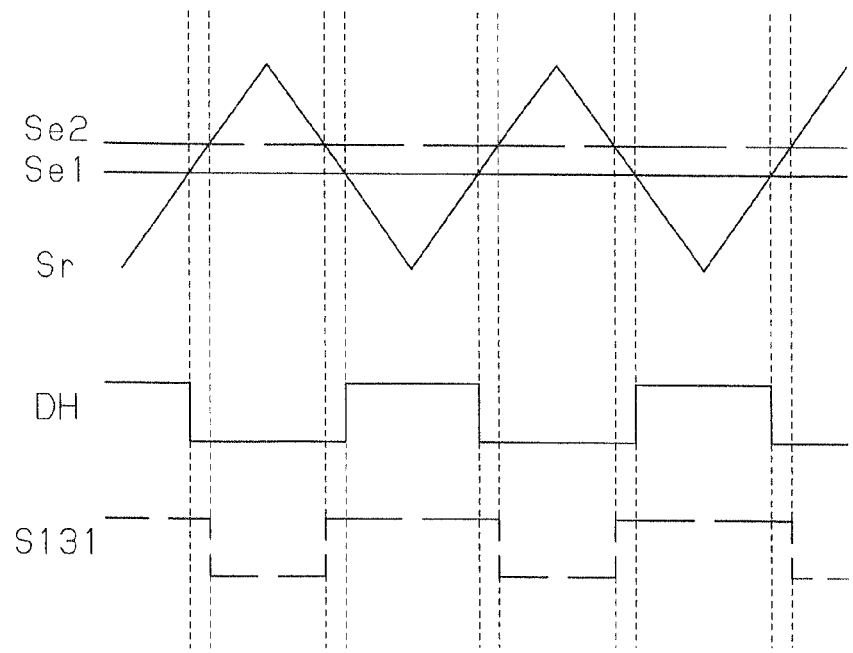
FIG. 29 is an operational waveform diagram of the DC-DC converter of FIG. 28.

The DC-DC converter 110a is a voltage controlled step-down DC-DC converter. A control circuit 111a of the DC-DC converter 110a includes a through current prevention pulse generation circuit 130a in addition to the elements of the control circuit 111 shown in FIG. 26. The through current prevention pulse generation circuit 130a includes a second PWM comparator 131 and a constant voltage supply e131. As shown in FIG. 29, the constant voltage supply e131 superimposes a set voltage on a first error signal Se1, which is output from an error amplifier 121, to generate a second error signal Se2. The second PWM comparator 131 is provided with a triangular wave signal Sr and the second error signal Se2. The second PWM comparator 131 compares the second error signal Se2 and the triangular wave signal Sr to generate a pulse signal S131 as a through current prevention pulse in accordance with the comparison result. The second PWM comparator 131 generates an H level pulse signal S131 when the voltage of the second error signal Se2 is higher than the voltage of the triangular wave signal Sr to generate an L level pulse signal S131 when the voltage of the second error signal Se2 is lower than the voltage of the triangular wave signal Sr. When the first transistor T1 is turned on, the second transistor T2 is turned off in response to the signal S131. This prevents a through current from flowing.

Figure 30:
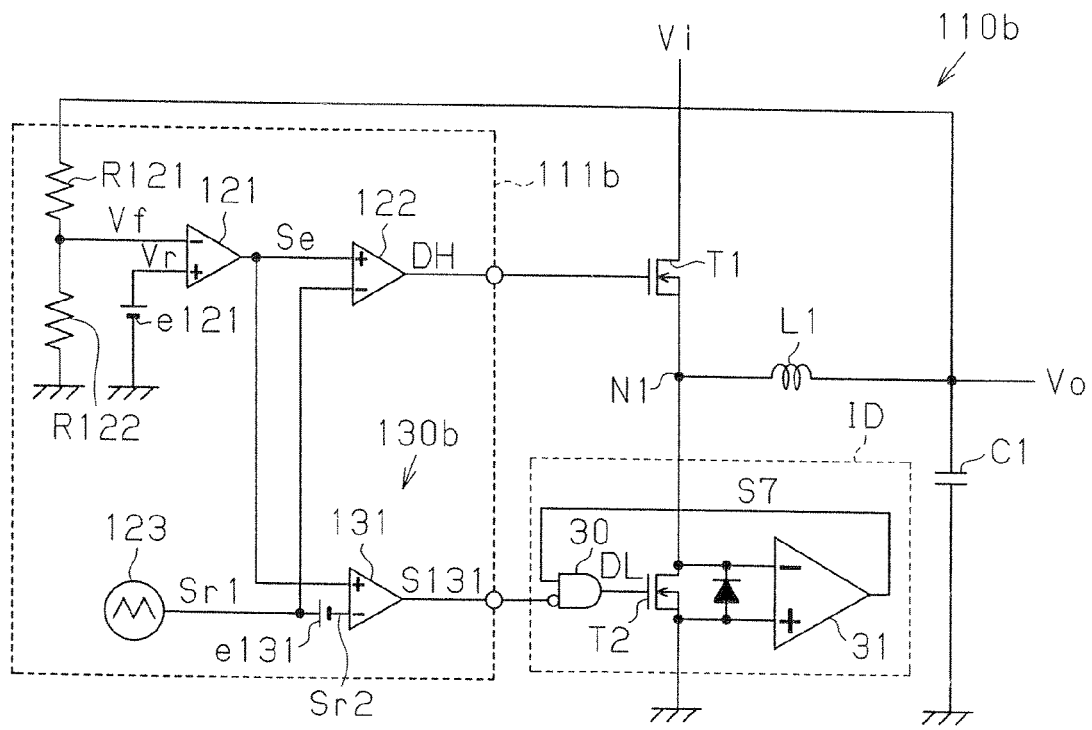
FIG. 30 is a schematic circuit diagram of a DC-DC converter according to an eighteenth embodiment of the present invention.

FIG. 30 is a schematic circuit diagram of a DC-DC converter 110b according to an eighteenth embodiment of the present invention.

Figure 31:
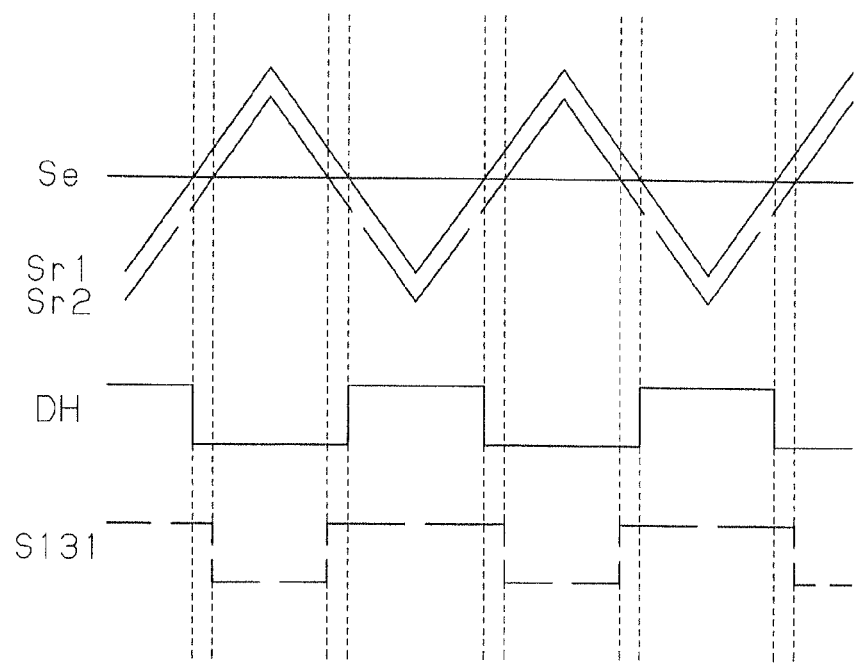
FIG. 31 is an operational waveform diagram of the DC-DC converter of FIG. 30.

A control circuit 111b of the DC-DC converter 10b includes a through current prevention pulse generation circuit 130b. The through current prevention pulse generation circuit 130b adds an offset, which is generated using a constant voltage supply e131, to a first triangular wave signal Sr1, which is generated by an OSC 123. The offset enables a first control signal DH and a pulse signal S131 to be generated at different timings as shown in FIG. 31. As a result, the first transistor T1 and the second transistor T2 do not go on at the same time.

Figure 32:
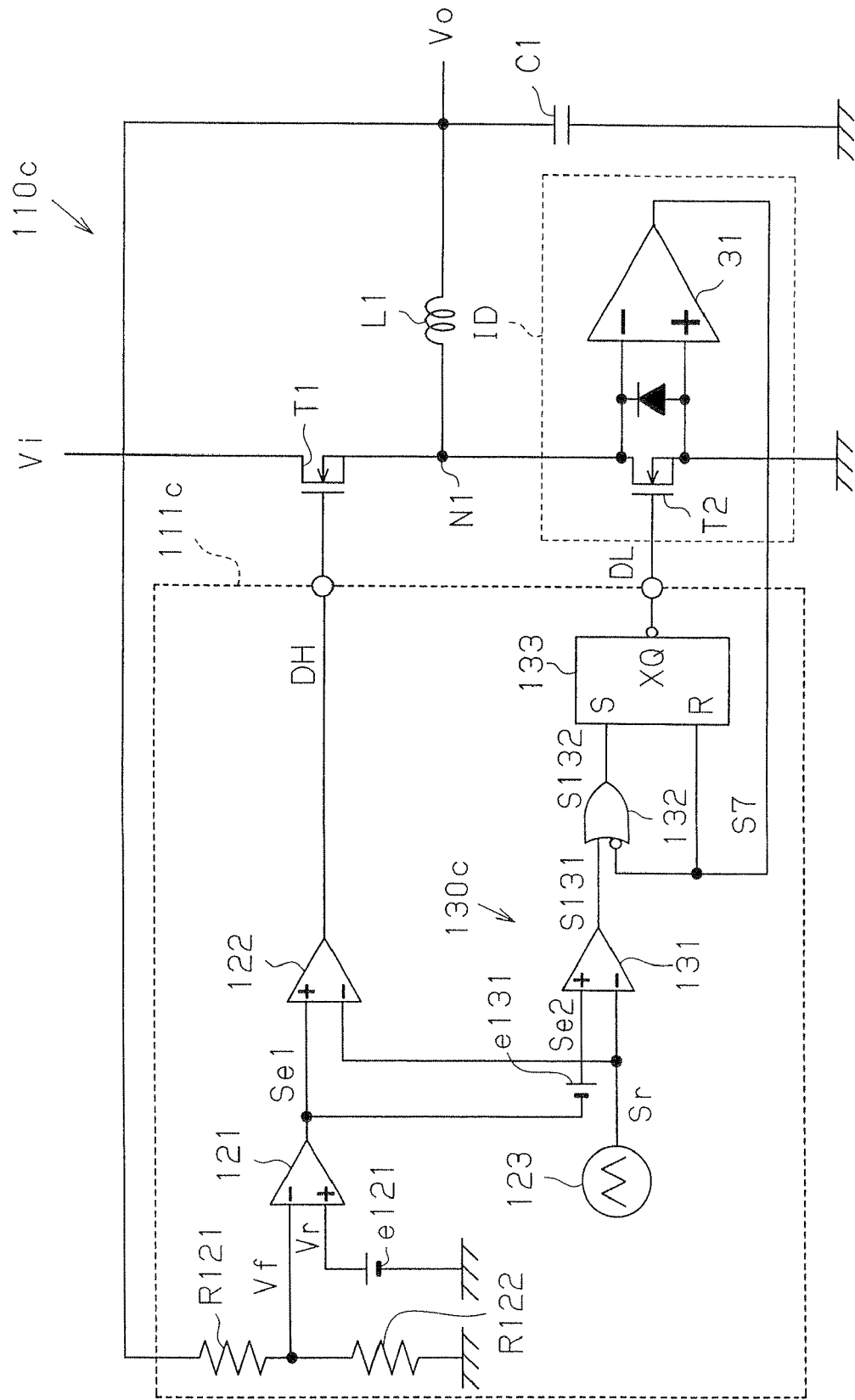
FIG. 32 is a schematic circuit diagram of a DC-DC converter according to a nineteenth embodiment of the present invention.

FIG. 32 is a schematic circuit diagram of a DC-DC converter 110c according to a nineteenth embodiment of the present invention.

A control circuit 111c of the DC-DC converter 110c includes a through current prevention pulse generation circuit 130c. The through current prevention pulse generation circuit 130c includes a constant voltage supply e131, a second PWM comparator 131, an OR circuit 132, and an RS-FF circuit 133. The OR circuit 132 performs the logical OR operation of an output signal of the second PWM comparator 131 (through current pulse signal S131) and an inversion signal of an output signal S7 of a comparator 31 to generate a signal S132 showing the operational result. The FF circuit 133 has a set terminal S provided with an output signal S132 of the OR circuit 132 and a reset terminal R provided with the output signal S7 of the comparator 31. Then, the FF circuit 133 generates a second control signal DL at its inversion output terminal XQ. With this structure, first and second transistors T1 and T2 do not go on at the same time as in the seventeenth embodiment.

Figure 33:
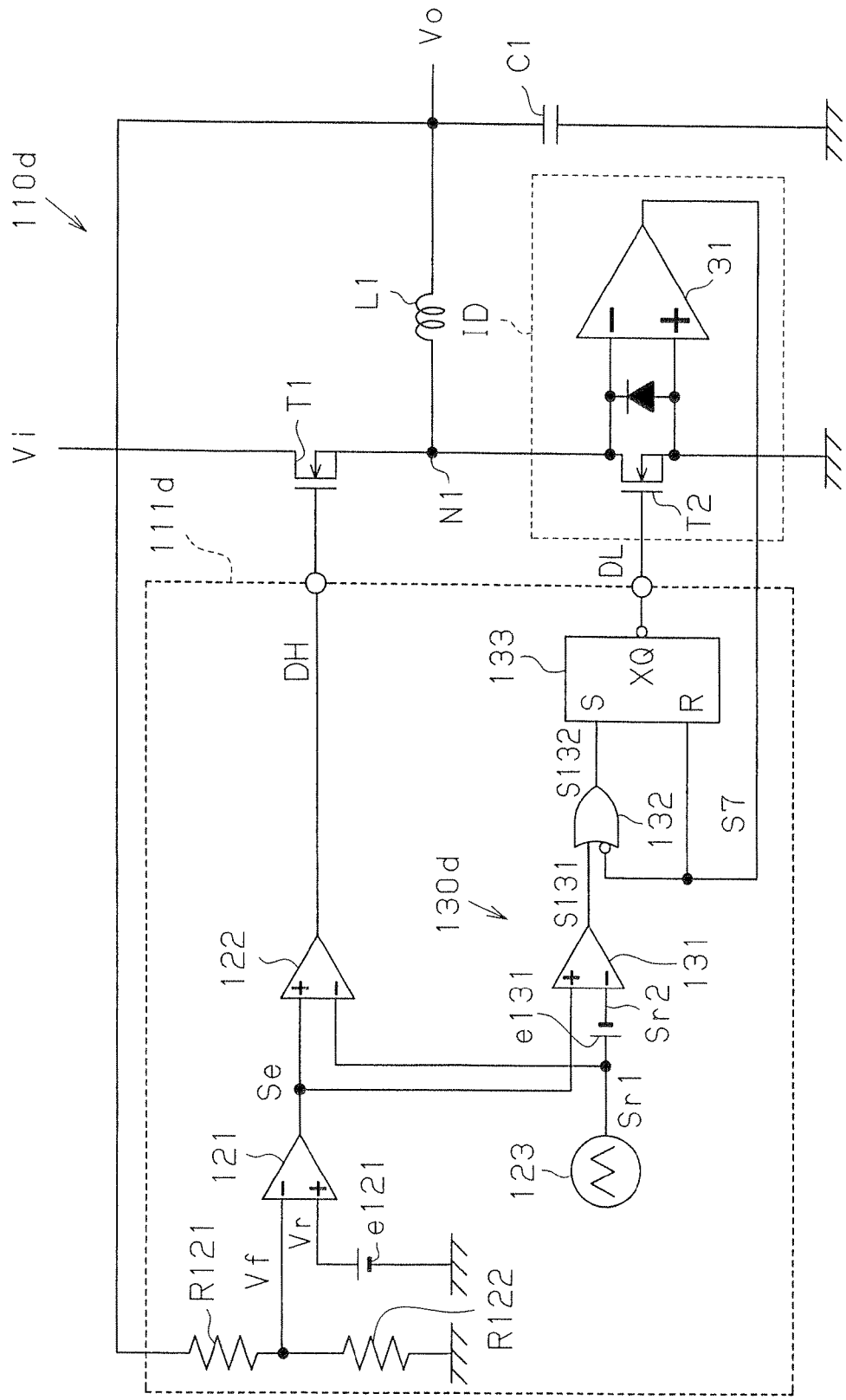
FIG. 33 is a schematic circuit diagram of a DC-DC converter according to a twentieth embodiment of the present invention.

FIG. 33 is a schematic circuit diagram of a DC-DC converter 110d according to a twentieth embodiment of the present invention.

A control circuit 111d of the DC-DC converter 110d includes a through current prevention pulse generation circuit 130d. The through current prevention pulse generation circuit 130d adds an offset, which is generated using a constant voltage supply e131, to a first triangular wave signal Sr1, which is generated by an OSC 123. With this structure, first and second transistors T1 and T2 do not go on at the same time as in the eighteenth embodiment.

Figure 34:
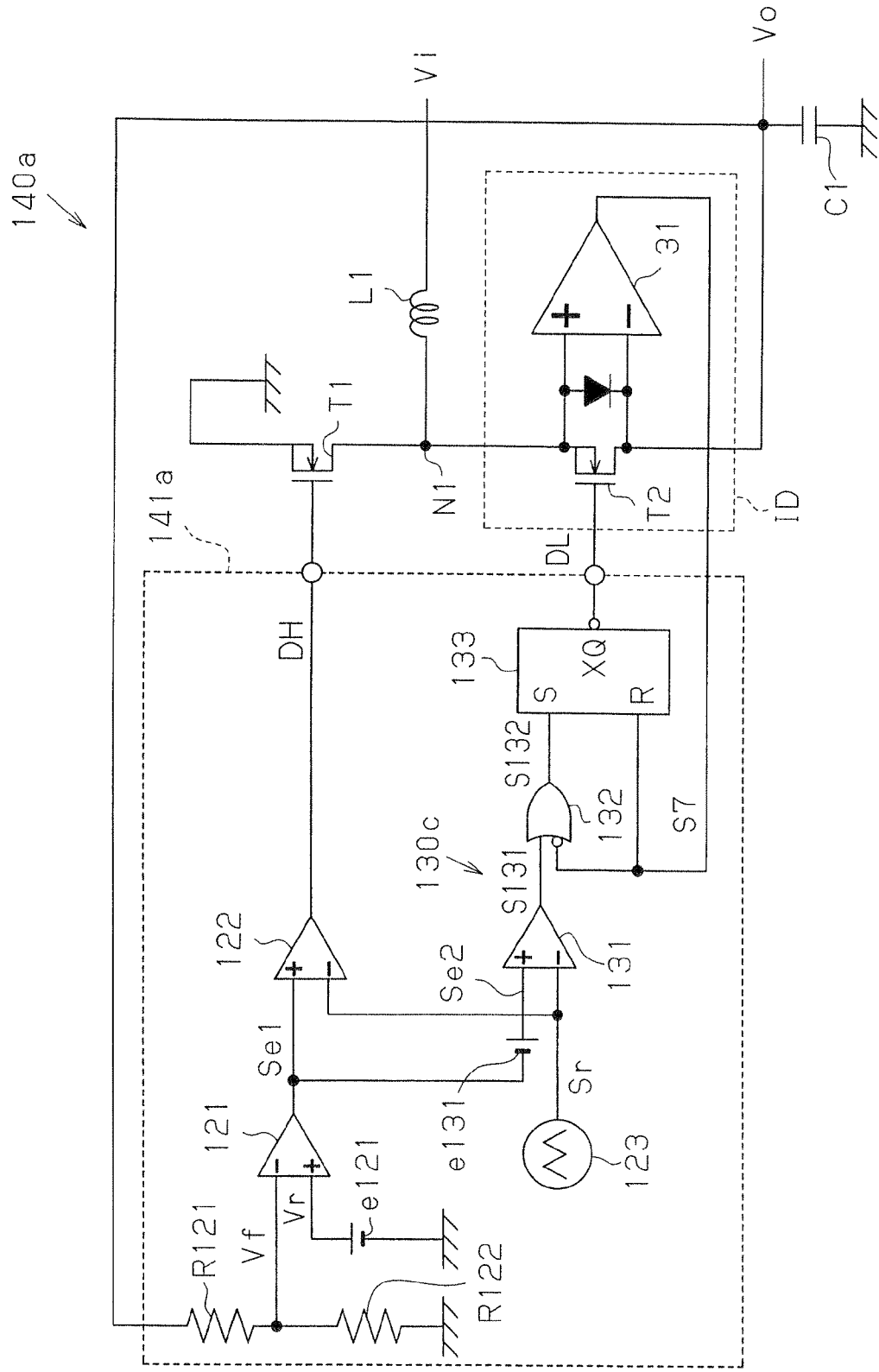
FIG. 34 is a schematic circuit diagram of a DC-DC converter according to a twenty-first embodiment of the present invention.
Figure 35:
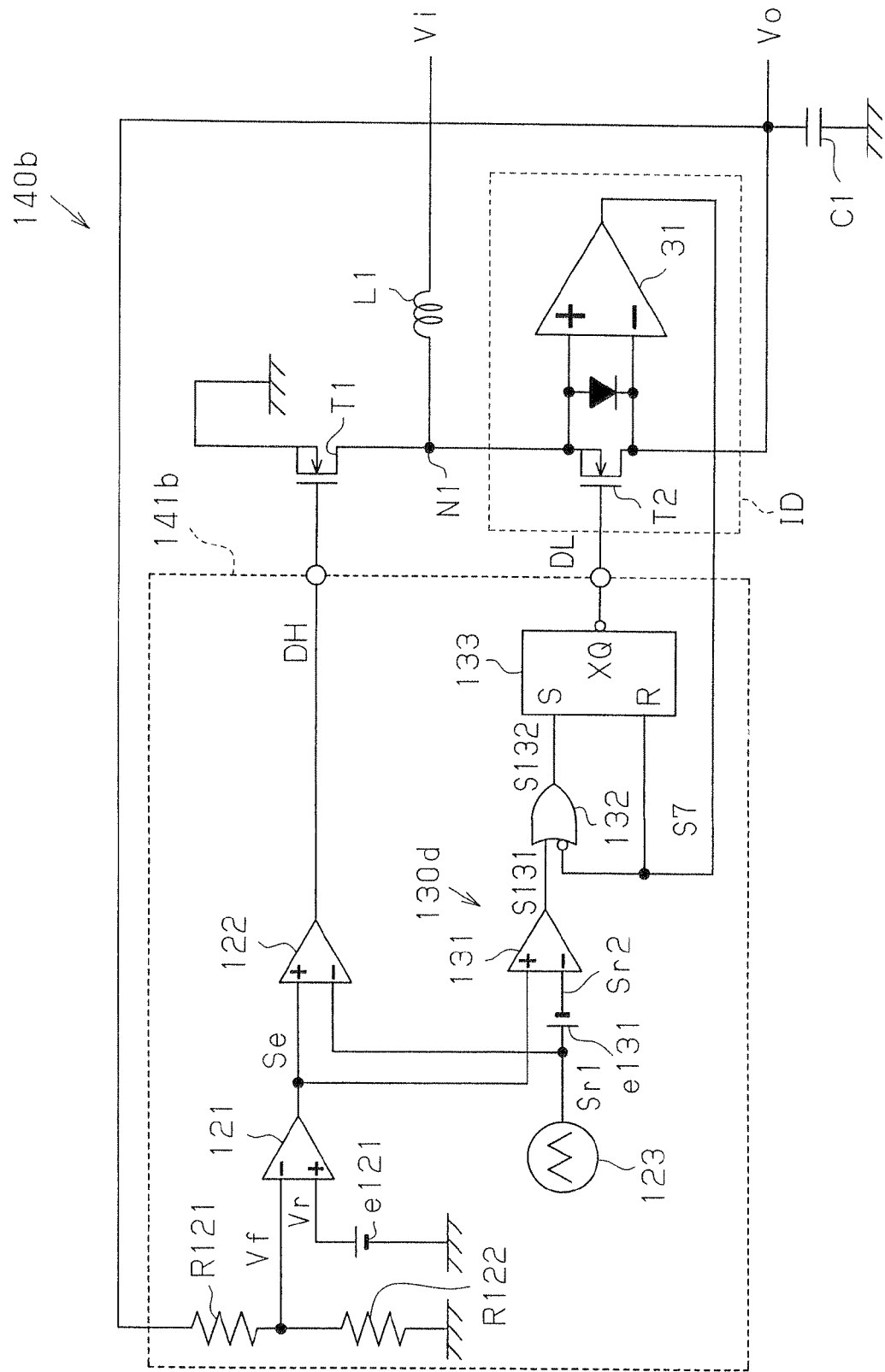
FIG. 35 is a schematic circuit diagram of a DC-DC converter according to a twenty-second embodiment of the present invention.

FIG. 34 shows a DC-DC converter 140a according to a twenty-first embodiment of the present invention. FIG. 35 shows a DC-DC converter 140b according to a twenty-second embodiment of the present invention. The DC-DC converter 140a and the DC-DC converter 140b are both voltage controlled step-up DC-DC converters. The present invention is also applicable to such voltage controlled step-up structures.

It should be apparent to those skilled in the art that the present invention may be embodied in many other specific forms without departing from the spirit or scope of the invention. Particularly, it should be understood that the present invention may be embodied in the following forms.

The control circuit 5 of the first embodiment has a structure obtained by functionally separating the through current prevention pulse generation circuit from each of the control circuits 11, 41, 71, 71a, 111, 111a to 111d, 141a, and 141b of the second to twenty-second embodiments. The control circuit 5 may also include the through current prevention pulse generation circuit 4.

The DC-DC converter of the second embodiment may additionally include a circuit section for switching its operations by using modes as in the third embodiment.

The circuit section for switching operations using modes may be eliminated from the DC-DC converter of the fourth embodiment as in the second embodiment.

The DC-DC converter of each of the above embodiments and the control circuit of the DC-DC converter of each of the above embodiments may be formed as a single-chip semiconductor or as a module, such as a printed circuit board. The DC-DC converter or the control circuit formed as a chip or a module may be used as a power supply device or may be incorporated in an electronics device.

The present examples and embodiments are to be considered as illustrative and not restrictive, and the invention is not to be limited to the details given herein, but may be modified within the scope and equivalence of the appended claims.

What is claimed is:

1. A DC-DC converter comprising:
a first transistor receiving an input voltage;
a second transistor coupled to the first transistor;
a control circuit generating a first signal which controls the first transistor to turn on and off;
a comparator for detecting current flowing through the second transistor to generate a second signal which controls the second transistor, and for turning on the second transistor after a first period from the first transistor is turned off;
a variable voltage supply which applies an offset voltage to the comparator, the variable voltage supply setting the offset voltage to a first level when the DC-DC converter is powered down and setting the offset voltage to a second level after a given delay time elapses from when the DC-DC converter recovers to a normal operation from a power down operation; and
a pulse generation circuit for controlling the first signal and the second signal for turning off the second transistor during a second period from before the first transistor is turned on.

2. The DC-DC converter according to claim 1, wherein the second period is greater than the first period.

3. A DC-DC converter comprising:
a first transistor receiving an input voltage;
a second transistor coupled to the first transistor;
a control circuit generating a first signal which controls the first transistor to turn on and off;
a comparator for detecting current flowing through the second transistor to generate a second signal which controls the second transistor to turn on and off;
a variable voltage supply which applies an offset voltage to the comparator, the variable voltage supply setting the offset voltage to a first level when the DC-DC converter is powered down and setting the offset voltage to a second level after a given delay time elapses from when the DC-DC converter recovers to a normal operation from a power down operation; and
a pulse generation circuit changing the first signal and the second signal,
wherein the second transistor is turned off before the first transistor is turned on, and the second transistor is turned on after each of the first transistor and the second transistor is turned off.

* * * * *